(12) United States Patent
Liaw

(10) Patent No.: US 12,317,468 B2
(45) Date of Patent: May 27, 2025

(54) MEMORY DEVICE AND MANUFACTURING THEREOF

(71) Applicant: TAIWAN SEMICONDUCTOR MANUFACTURING COMPANY, LTD., Hsinchu (TW)

(72) Inventor: Jhon Jhy Liaw, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 835 days.

(21) Appl. No.: 17/393,991

(22) Filed: Aug. 4, 2021

(65) Prior Publication Data

US 2022/0336474 A1   Oct. 20, 2022

Related U.S. Application Data

(60) Provisional application No. 63/175,174, filed on Apr. 15, 2021.

(51) Int. Cl.
| | |
|---|---|
| *H10B 10/00* | (2023.01) |
| *B82Y 10/00* | (2011.01) |
| *G11C 11/412* | (2006.01) |
| *G11C 11/418* | (2006.01) |
| *H01L 23/485* | (2006.01) |
| *H01L 23/528* | (2006.01) |
| *H02K 15/027* | (2025.01) |
| *H10D 12/01* | (2025.01) |
| *H10D 30/67* | (2025.01) |
| *H10D 62/10* | (2025.01) |
| *H10D 84/00* | (2025.01) |

(52) U.S. Cl.
CPC .......... *H10B 10/125* (2023.02); *G11C 11/418* (2013.01); *H01L 23/528* (2013.01); *H10B 10/18* (2023.02); *H10D 30/6735* (2025.01); *H10D 30/6757* (2025.01); *H10D 62/118* (2025.01)

(58) Field of Classification Search
CPC .... H10B 10/125; H10B 10/18; G11C 11/418; G11C 11/412; G11C 11/411; G11C 11/416; H01L 23/528; H01L 29/0665; H01L 29/42392; H01L 29/78696; H01L 27/0207; H01L 21/823871; H01L 27/092; H01L 29/66439; H01L 29/775; H01L 29/0673; H01L 23/485; H01L 23/5286; B82Y 10/00
See application file for complete search history.

(56) References Cited

U.S. PATENT DOCUMENTS

| | | |
|---|---|---|
| 7,269,056 B1 | 9/2007 | Liaw |
| 7,365,432 B2 | 4/2008 | Liaw |
| 8,737,107 B2 | 5/2014 | Liaw |

(Continued)

*Primary Examiner* — Yara B Green
*Assistant Examiner* — Akhee Sarker-Nag
(74) *Attorney, Agent, or Firm* — Cooper Legal Group, LLC

(57) ABSTRACT

Embodiments of the present disclosure relates to an integrated circuit including an array of memory cells connected to word lines and bit lines located on opposite sides of the memory cells. The memory cell may include gate all around transistors. A memory circuit according to the present disclosure also includes edge cells having word line tap structures configured to connect front side word lines with back side word lines. Some embodiments of the present disclosure provide an IC chip having memory cells with power rail on the front side and logic cells with power rail on the back side.

20 Claims, 35 Drawing Sheets

(56) References Cited

U.S. PATENT DOCUMENTS

| | | | |
|---|---|---|---|
| 8,947,902 B2 | 2/2015 | Liaw | |
| 9,209,247 B2 | 12/2015 | Colinge et al. | |
| 9,236,267 B2 | 1/2016 | De et al. | |
| 9,349,436 B2 | 5/2016 | Liaw | |
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 10,170,408 B2 | 1/2019 | Liaw | |
| 2009/0086559 A1* | 4/2009 | Ohsawa | G11C 11/406 365/205 |
| 2015/0187642 A1* | 7/2015 | Batra | H01L 21/76898 257/774 |
| 2017/0243872 A1* | 8/2017 | Chen | H10D 89/10 |
| 2018/0005938 A1* | 1/2018 | Liaw | H10B 12/30 |
| 2019/0287957 A1* | 9/2019 | Anderson | G11C 11/41 |

* cited by examiner

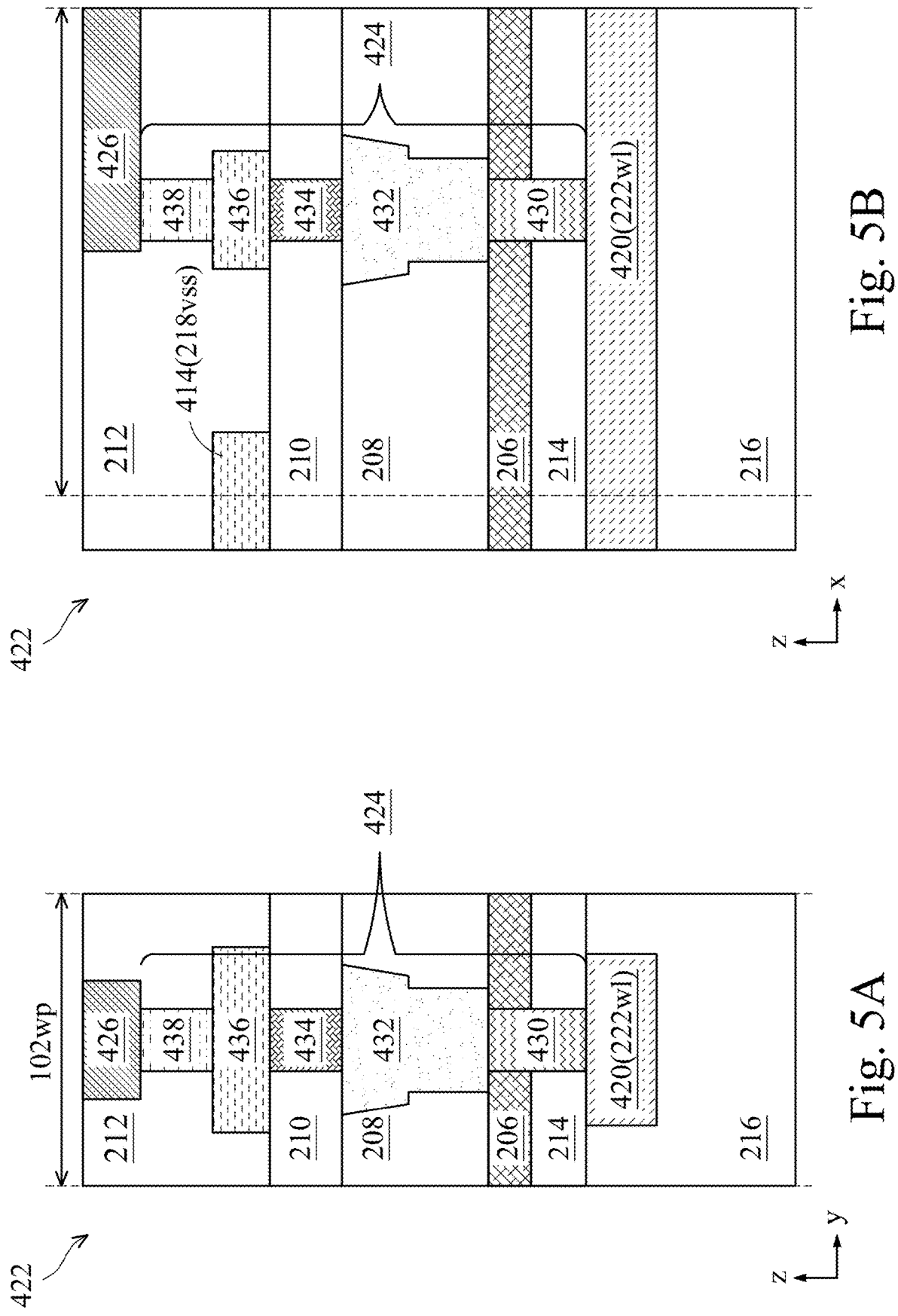

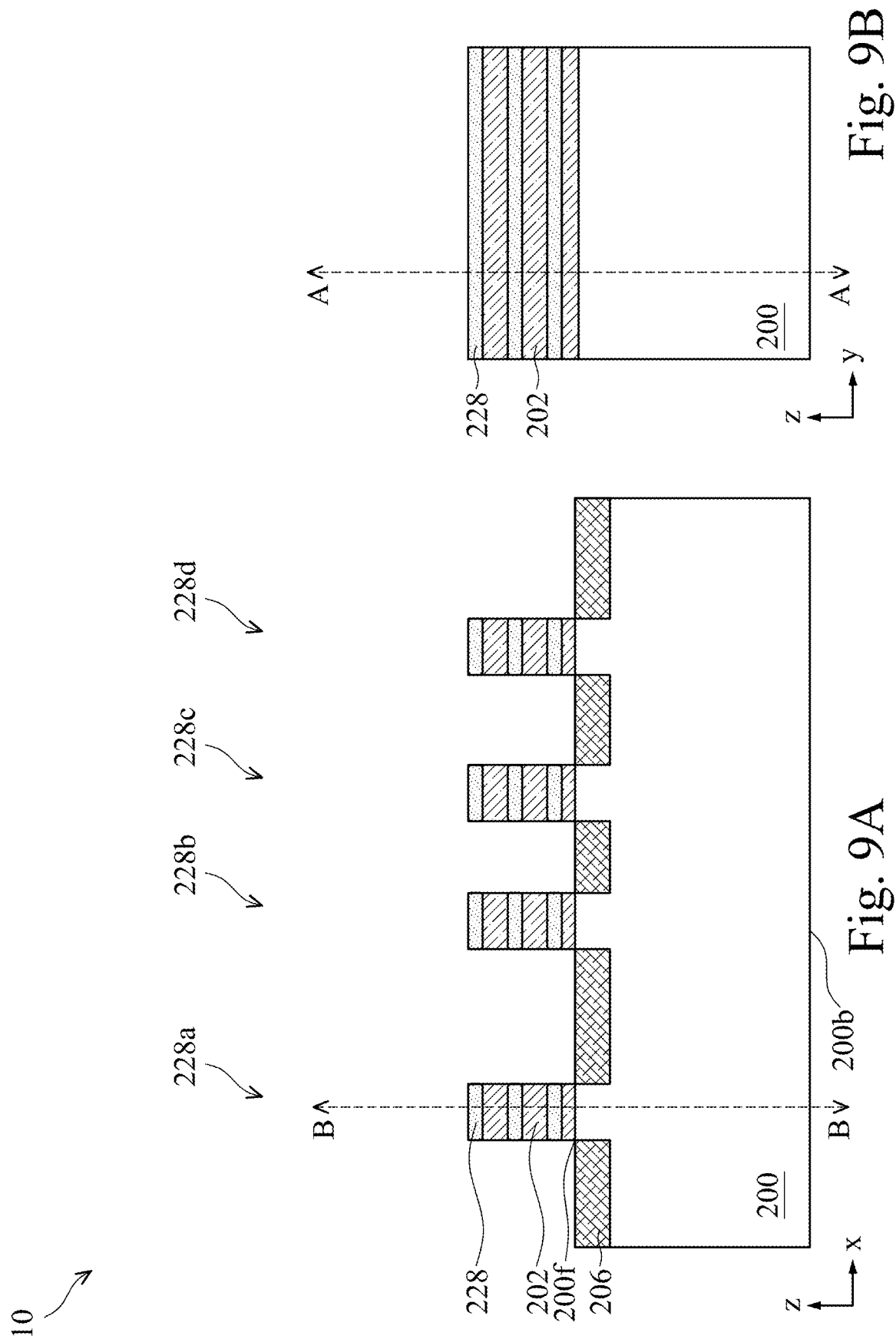

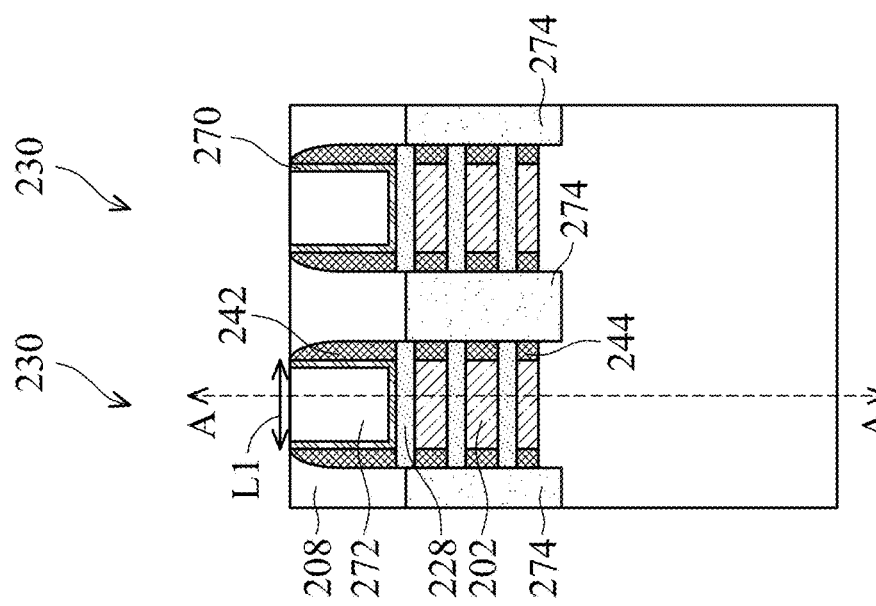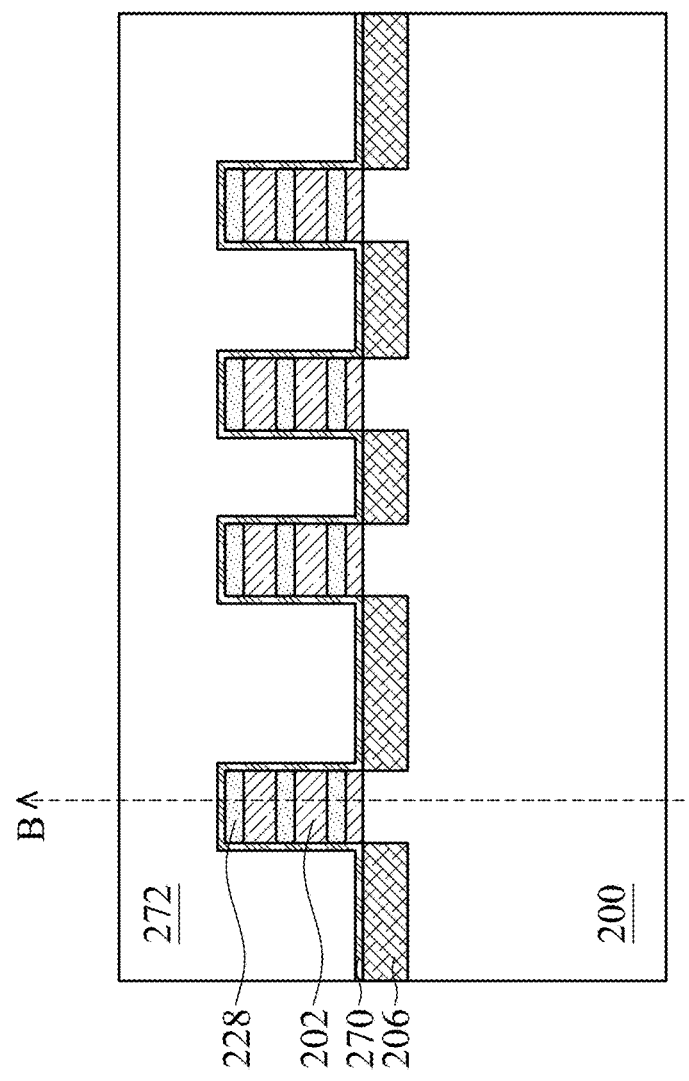
Fig. 10A
Fig. 10B

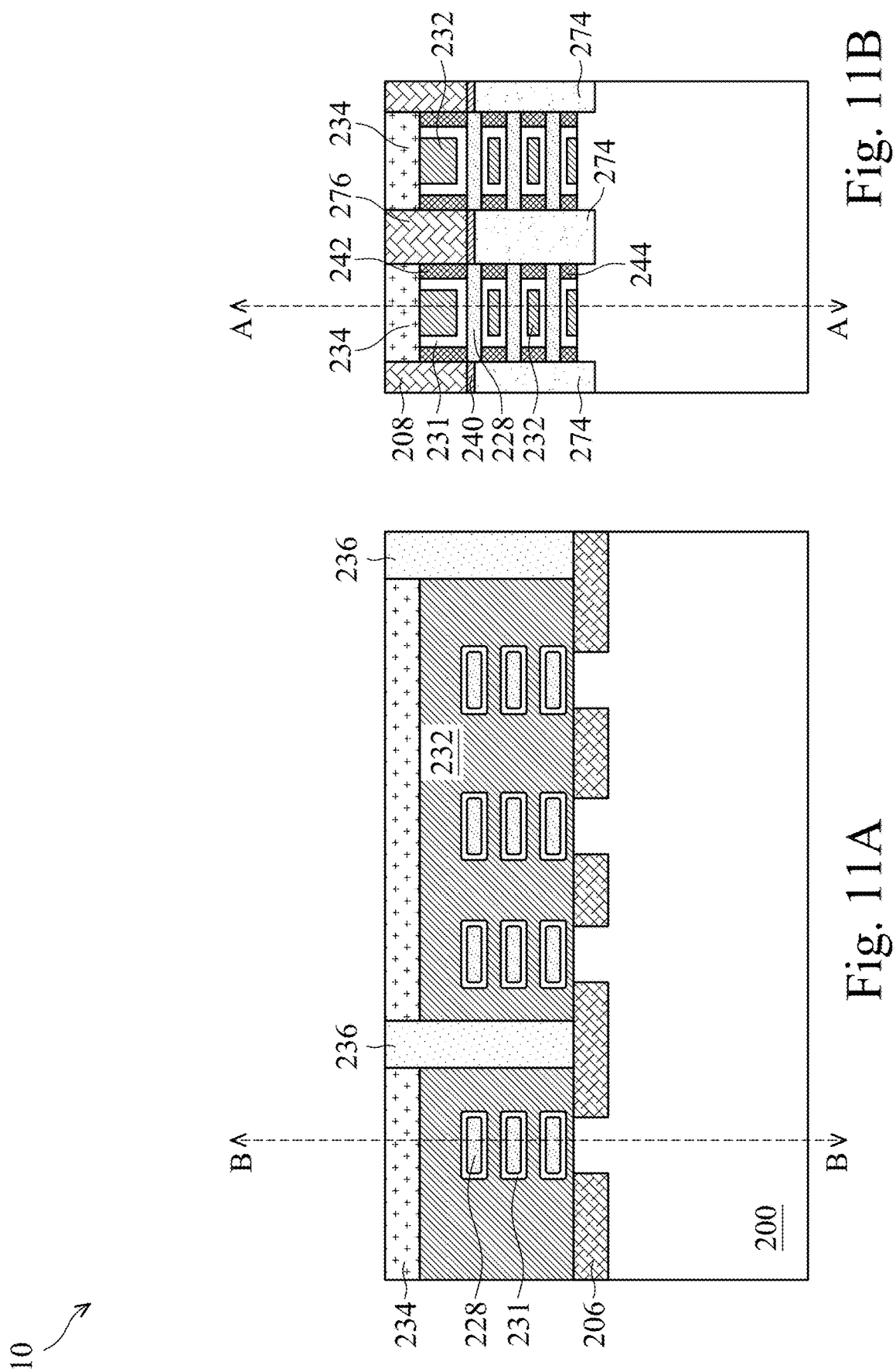

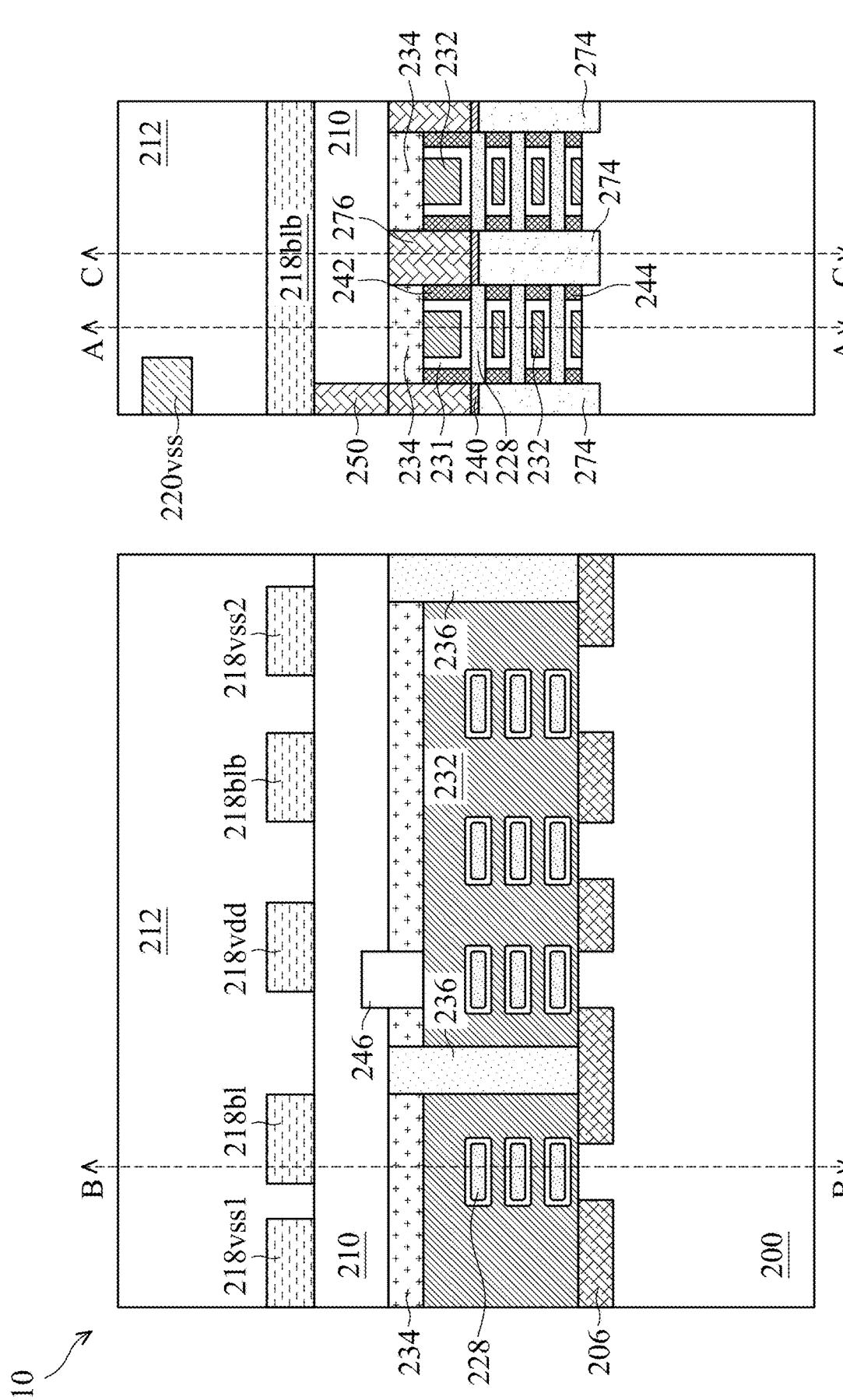

MEMORY DEVICE AND MANUFACTURING THEREOF

BACKGROUND

The semiconductor integrated circuit (IC) industry has produced a wide variety of digital devices to address issues in a number of different areas. Some of these digital devices are electrically coupled to static random-access memory (SRAM) devices for the storage of digital data. As ICs have become smaller and more complex, for example, by introducing gate all around (GAA) transistors in SRAM, the effects of cross talk and wiring resistance further affect IC performance. For example, routing conductors, such as Word lines and Bit lines in a memory circuit, would generate RC delay as well as coupling noise. The RC delay and coupling noises of the routing conductors may slow down the cell speed and/or limit scaling ratio.

Therefore, there is a need to lower RC loading in embedded memory and SOC (system-on-chip) IC products to meet speed requirements while scaling down.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5A and 5B are schematical sectional views of an edge cell according to embodiments of the present disclosure.

FIGS. 9A-9B, 10A-10B, 11A-11B, 12A-12C, 13A-13C, 14A-14C, and 15A-15C schematically illustrate various stages of manufacturing an integrated circuit according to the method of FIG. 8.

DETAILED DESCRIPTION

Figure 1:
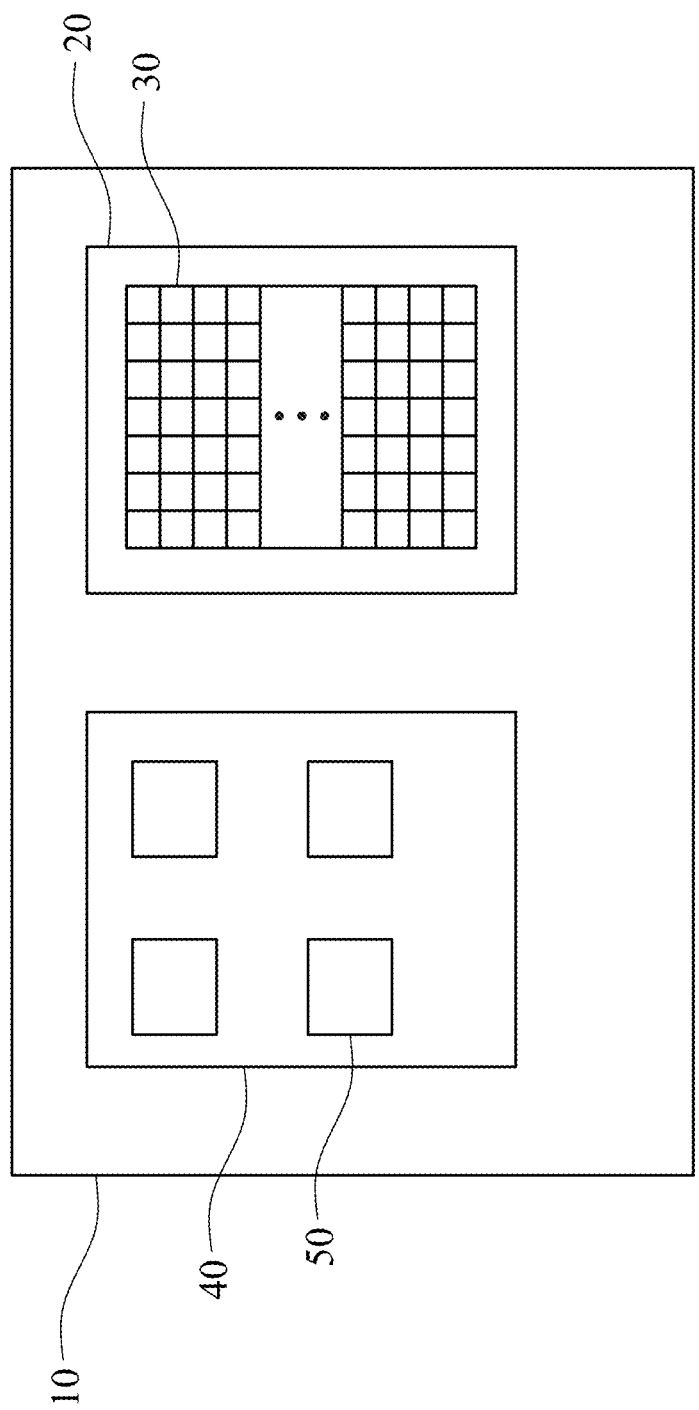
FIG. 1 is a simplified diagram of an integrated circuit in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 64 degrees or at other orientations) and the spatially relative descriptors used herein may likewise be interpreted accordingly.

The foregoing broadly outlines some aspects of embodiments described in this disclosure. While some embodiments described herein are described in the context of nanosheet channel FETs, implementations of some aspects of the present disclosure may be used in other processes and/or in other devices, such as planar FETs, Fin-FETs, GAA (Gate All Around) FETs, such as Horizontal Gate All Around (HGAA) FETs, and Vertical Gate All Around (VGAA) FETs, and other suitable devices. A person having ordinary skill in the art will readily understand other modifications that may be made are contemplated within the scope of this disclosure. In addition, although method embodiments may be described in a particular order, various other method embodiments may be performed in any logical order and may include fewer or more steps than what is described herein. In the present disclosure, a source/drain refers to a source and/or a drain. A source and a drain are interchangeably used.

Embodiments of the present disclosure relates to an integrated circuit including an array of memory cells connected to word lines and bit lines formed opposite sides of the memory cells. A memory circuit according to the present disclosure also includes edge cells having word line tap structures configured to connect front side word lines with back side word lines. Some embodiments of the present disclosure provide an IC chip having memory cells with power rail on the front side and logic cells with power rail on the back side.

FIG. 1 is a simplified diagram of an integrated circuit 10 in accordance with some embodiments of the present disclosure. The integrated circuit 10 includes a memory circuit 20 and a logic circuit 40. In some embodiments, the memory circuit 20 and logic circuit 40 include GAA transistors.

The memory circuit 20 may include one or more memory array 30 of multiple memory cells arranged in rows and columns. In some embodiments, the memory cells in the memory array 30 may have the same circuit configuration and the same semiconductor structure. In some embodiments, the logic circuit 40 may be the controller for accessing the memory circuit 20. In some embodiments, the logic circuit 40 includes circuits configured to perform a specific function or operation according to data stored in the memory circuit 20. The logic circuit 40 includes multiple logic cells 50. In some embodiments, the logic cell 50 may be a standard cell (STD cell), e.g., inverter (INV), AND, OR, NAND, NOR, Flip-Flop, SCAN and so on. In some embodiments, the logic cells 50 corresponding to the same function or operation may have the same circuit configuration with different semiconductor structures for providing various threshold voltages (Vth or Vt). In some embodiments, the integrated circuit 10 may be a system on chip (SOC) circuit with embedded memory circuits.

Figure 2A:
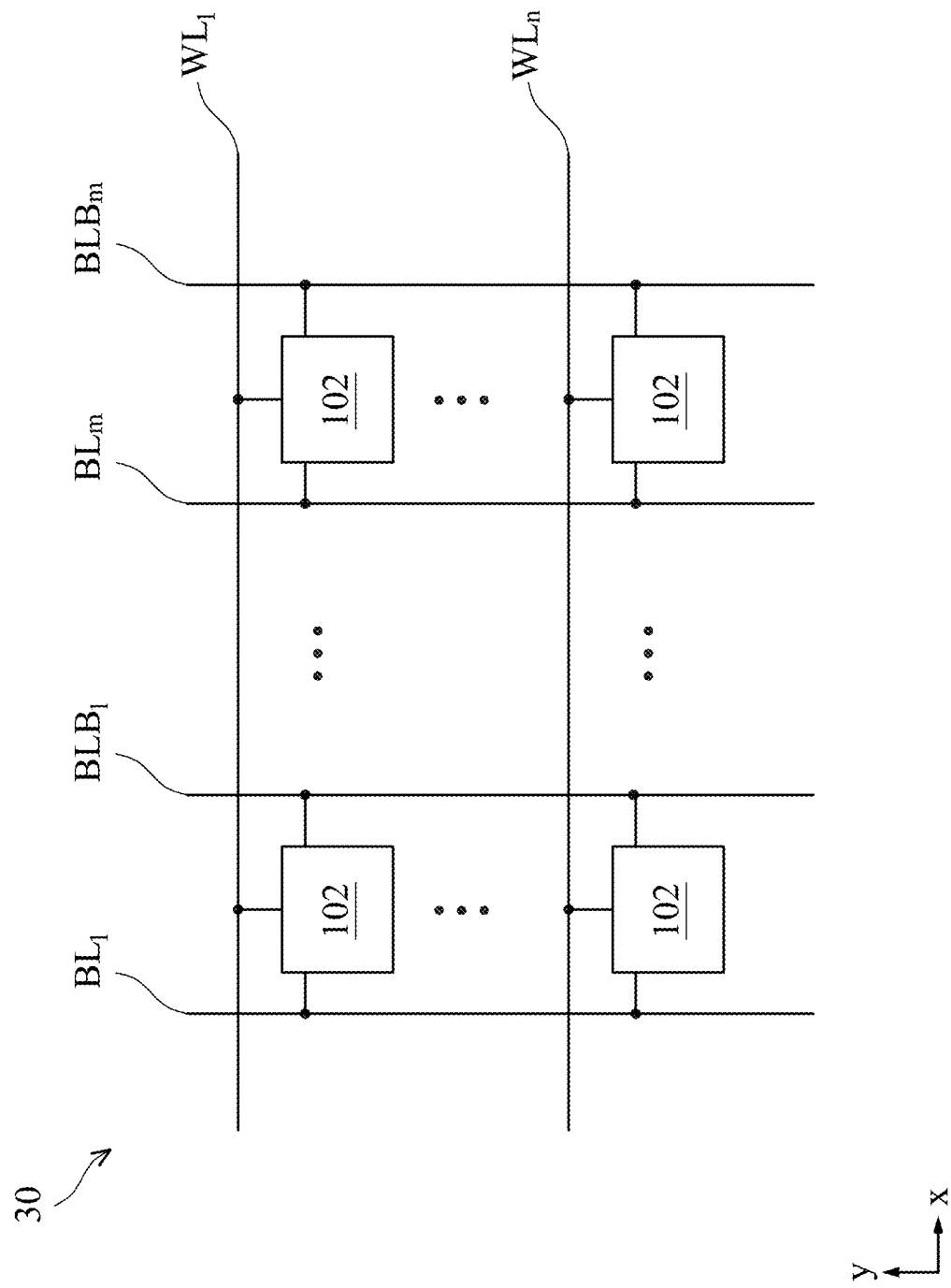
FIG. 2A schematically illustrates an array of memory cells arranged in rows and columns according to the embodiments of the present disclosure.

FIG. 2A schematically illustrates the memory array 30 the embodiments of the present disclosure. In some embodiments, the memory array 30 is a static random-access memory ("SRAM") array including a plurality of bit cells 102. The bit cells 102 are arranged in a number, n, of rows and a number, m, of columns. Each bit cella 102is coupled to a word line, WL (one of $WL_1$ to $WL_n$), that extends horizontally across the memory array 30 (i.e., in an x-direction) and two complementary bit lines BL (one of $BL_1$ to $BL_m$) and its complement BLB (one of $BLB_1$ to $BLB_m$) that extend vertically across the memory array 30 (i.e., in a y-direction).

Figure 2B:
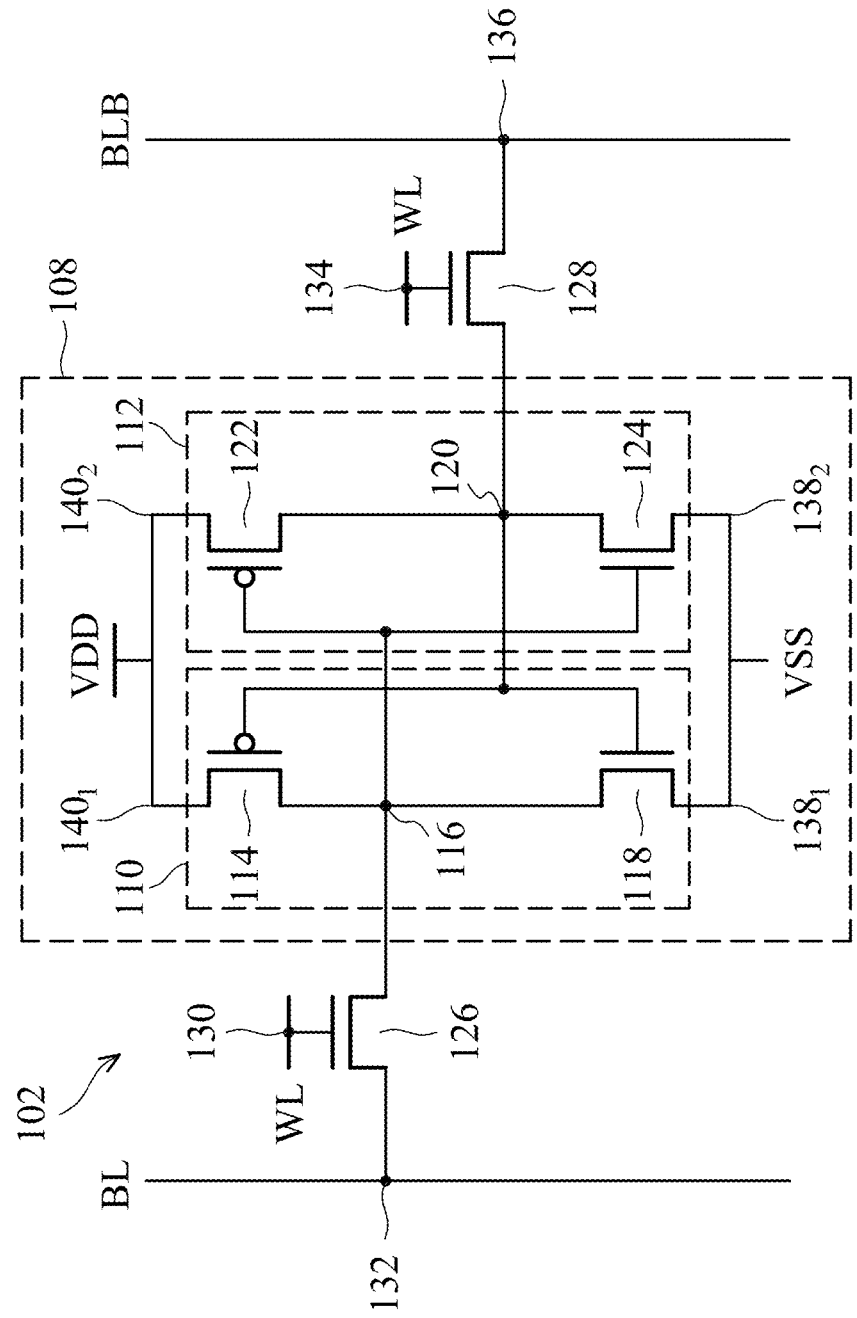
FIG. 2B schematically illustrates one example of a memory bit cell according to embodiments of the present disclosure.

FIG. 2B is a schematic diagram of the bit cell 102 according to embodiments of the present disclosure. The bit cell 102 is a six-transistor ("6T") SRAM cell. Each bit cell 102 includes a latch 108 formed by a pair of cross coupled inverters 110, 112. The inverter 110 includes a PMOS (p-channel metal-oxide semiconductor) transistor % 114 and a NMOS (n-channel metal-oxide semiconductor) transistor 118. The PMOS transistor 114 includes a source coupled to a high-voltage source, VDD at a node $140_1$, and a drain coupled to a node 116. The node 116 serves as the output of the inverter 110. The NMOS transistor 118 of the inverter 110 has a source coupled to low-voltage source VSS at a node $138_1$, and a drain coupled to the node 116. Gates of the transistors 114 and 118 are coupled together at a node 120. The node 120 serves as the input of the inverter 110 and the output of the inverter 112. The inverter 112 includes a PMOS transistor 122 and a NMOS transistor 124. The PMOS transistor 122 has a source coupled to VDD at a node $140_2$, a gate coupled to the node 116, and a drain coupled to the node 120. The NMOS transistor 124 has a source coupled to VSS at a node $138_2$, a drain coupled to the node 120, and a gate coupled to the node 116. In some embodiment, the nodes $138_1$, $138_2$ are larger in dimension than the nodes 132, 136, $140_1$, $140_2$.

The bit cell102 also includes a pair of pass transistors 126, 128. In some embodiments, the pass transistors 126, 128 are NMOS transistors, although one skilled in the art will understand that the pass transistors 26, 28 may be implemented as PMOS transistors. The pass transistor 126 has a gate coupled to the word line WL at a node 130, a source coupled to the node 116, and a drain coupled to the bit line BL at a node 132. The transistora 128 has a gate coupled to the word line WL at a node 134, a source coupled to the node 120, and a drain coupled to the complementary bit line BLB at a node 136.

The transistors of the bit cell 102 may be formed in one or more doped regions of a semiconductor substrate using various technologies. In some embodiments, the transistors of the bit cell 102 may be GAA FETs, such as HGAA-FETs, VGAA FETs, and other suitable devices. Alternatively, the transistors of the bit cell 102 may be formed in any suitable transistors, such as bulk planar metal oxide semiconductor field effect transistors ("MOSFETs"), bulk Fin-FETs having one or more fins or fingers, semiconductor on insulator ("SOI") planar MOSFETs, SOI Fin-FETs having one or more fins or fingers, or combinations thereof. The gates of the transistors in the bit cell 102 may include a polysilicon ("poly")/silicon oxynitride ("SiON") structure, a high-k/metal gate structure, or combinations thereof. Examples of the semiconductor substrate include, but are not limited to, bulk silicon, silicon-phosphorus ("SiP"), silicon-germanium ("SiGe"), silicon-carbide ("SiC"), germanium ("Ge"), silicon-on-insulator silicon ("SOI-Si"), silicon-on-insulator germanium ("SOI-Ge"), or combinations thereof.

Figure 3A:
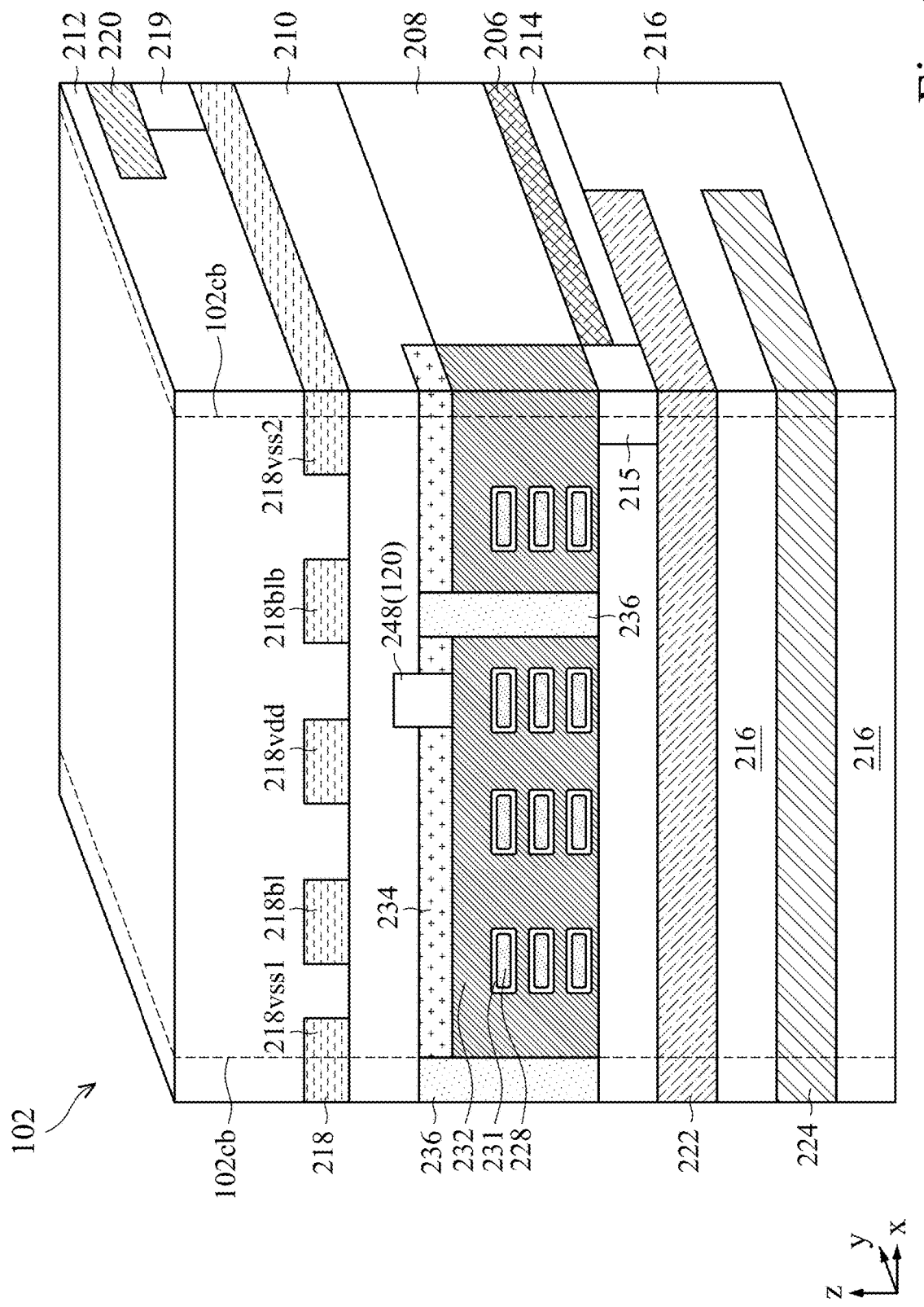
FIGS. 3A-3L are various views of a SRAM bit cell according to embodiments of the present disclosure.

FIGS. 3A-3L are various views of the bit cell 102 according to embodiments of the present disclosure. FIG. 3A is a schematic perspective sectional view of the bit cell 102. FIGS. 3B-3G are schematic layouts of various layers of the bit cell 102. As shown in FIG. 3A, which is a perspective view of the bit cell 102 with a section along the line Xcut-0 of FIG. 3B, the bit cell 102 may be formed on and in a semiconductor substrate. Dotted lines indicate a cell boundary 102cb of the bit cell 102. The bit cell 102 may be a 6-transistor SRAM cell as shown in FIG. 2B. For example, the transistors 114, 118, 122, 124, 126, 128 of the bit cell 102.

The transistors 114, 118, 122, 124, 126, 128 may be formed on a semiconductor substrate during FEOL (front end of line) processes and embedded in a STI (shallow trench isolation) layer 206 and an ILD (interlayer dielectric layer IL) layer 208 (collectively as a device layer). As shown in FIG. 3A, conductive features connected to gate electrodes and/or source/drain features of the transistors may be formed on the front side of the device layer in MEOL (middle end of line) processes and embedded in an ILD layer 210.

The bit cell 102 includes front side interconnect features in a front side IMD (inter-metal dielectric) layer 212. The front side IMD layer 212 is formed over the ILD layer 210. The front side IMD layer 212 may include one or more dielectric layers of dielectric materials with layers of conductive lines and vias embedded therein. One or more conductive layers may be formed in the front side IMD layer 212. Each conductive layer defines a plane in the x-direction and y-direction and may be separated from each other by dielectric material in the front side IMD layer 212. As will be understood by one skilled in the art, vias extend in the vertical direction, i.e., z-direction, to provide interconnects between conductive layers in the front side IMD layer 212.

In FIG. 3A, a first conductive layer (or M1) 218 and a second conductive layer (or M2) 220 are show embedded the front side IMD layer 212. Conductive vias 219 are formed to connect conductive features in the first conductive layer 218 and conductive features in the second conductive layer 220. Additional conductive layers may be formed over the second conductive layer 220 in the front side IMD layer 212. In some embodiments, the first conductive layer (or M1) 218 includes bit lines, and conductive features for connecting the bit cell 102 to the low-voltage power source VSS and the high-voltage power source VDD. The second conductive layer (or M2) 220 includes conductive features to form a power mesh to the low-voltage power source VSS.

The bit cell 102 may include a back side dielectric layer 214 having back side gate contact features 215 formed therein. The back side dielectric layer 214 may be formed under the transistors and the STI layer 206. The bit cell 102 further includes back side interconnect features in a back side IMD (inter-metal dielectric) layer 216. In some embodiments, the back side IMD layer 216 may be formed under the back side dielectric layer 214. The back side IMD layer 216 may include one or more dielectric layers of dielectric materials with layers of conductive lines and vias embedded therein. One or more conductive layers may be formed in the back side IMD layer 216. Each conductive layer defines a plane in the x- and y-direction and may be separated from each other by dielectric material in the back side IMD layer 216. As will be understood by one skilled in the art, vias extend in the vertical direction, i.e., z-direction, to provide interconnects between conductive layers in the back side IMD layer 216. In FIG. 3A, a first conductive layer (or BM1) 222 and an optional second conductive layer (or BM2) 224 are shown embedded the back side IMD layer 216. Conductive vias (not shown) are formed to connect conductive features in the first conductive layer 222 and conductive features in the second conductive layer 224. Additional conductive layers may be formed in the back side IMD layer 216. In some embodiments, the first conductive layer (or BM1) 222 includes a word line. The second conductive layer (or BM2) 224 includes a second word line electrically connected to the word line in the first conductive layer (or BM1) 222.

Figure 3B:
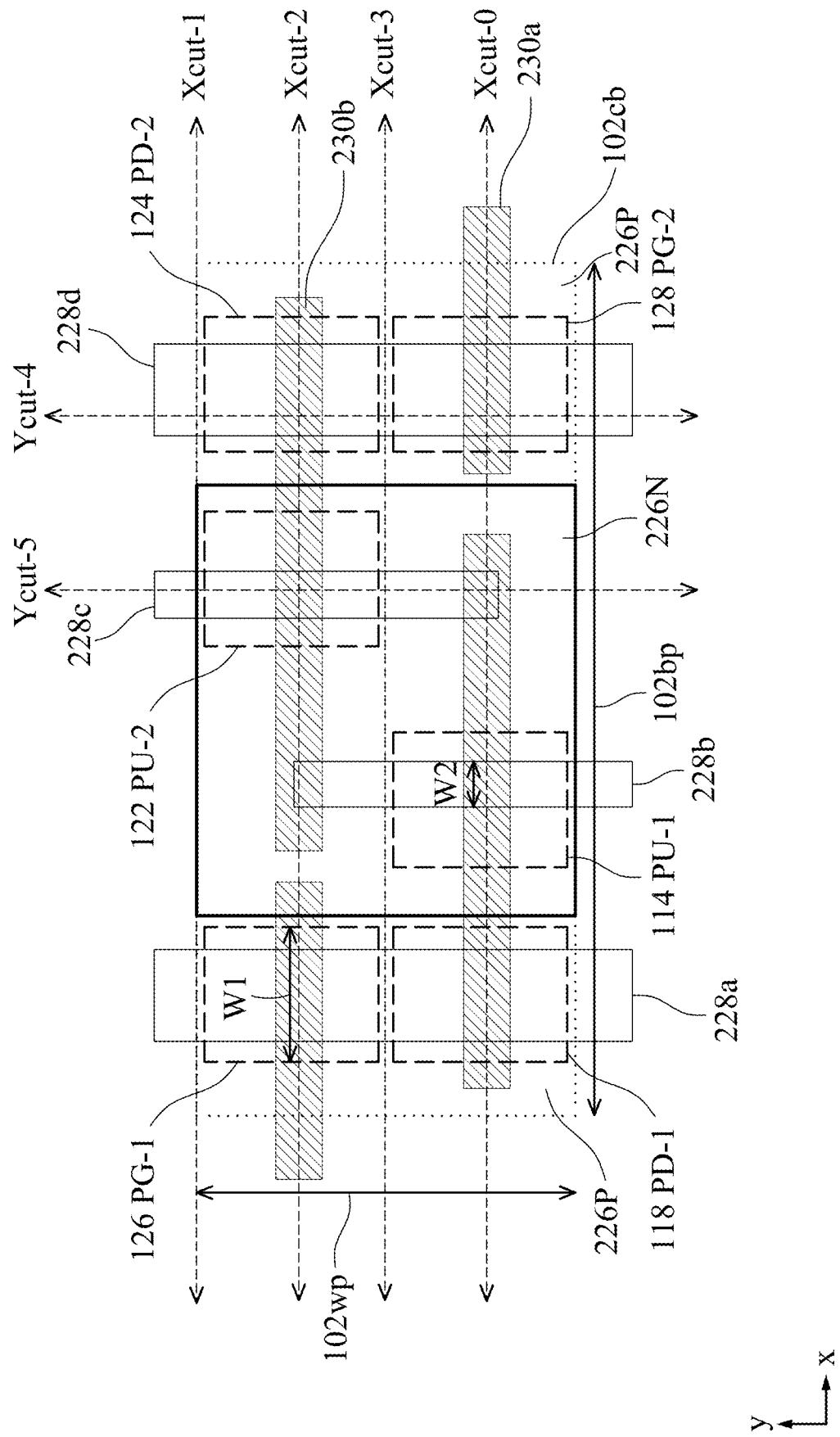

FIG. 3B is a schematic layout of the transistors in the bit cell 102 of FIG. 3A according to one embodiment of the present disclosure. The bit cell 102 is formed within the cell boundary 102cb having a length 102bp that extends in the x-direction a width 102wp that extends in the y-direction. In some embodiments, the bit cell 102 is a thin style cell in rectangular shape having the length 102bp longer than the width 102wp. In some embodiments, the ratio the length 102bp to the width 102wp is greater than 2.

In some embodiments, as shown in FIGS. 3A-3L, the bit lines in a memory array, such as the memory array 30, are arranged along the y-direction, the length 102bp represents the bit line pitch of the memory array; and the word lines of the memory array are arranged along the x-direction, the width 102wp represents the word line pitch of the memory array. Arranging the bit lines along the short edge of a rectangular bit cell is frequently used for embedded SRAM circuits because it is lithograph friendly, for example, fin structure layout, sacrificial gate structure patterning, and contact feature patterning, as well as bit line for speed improvement. As IC scaling down, each word line is connected to an increasing number of bit cells resulting in longer word lines and increased conductor resistance in the word lines. By arranging the word lines and bit lines on opposite sides of the bit cell 102, embodiments of the present disclosure enable wider word lines, thus reducing word line resistance.

Transistors of the bit cell 102 are formed over a pair of p-wells 226p and a n-well 226n positioned between the pair of p-well 226p. Fin structures 228a, 228b, 228c, 228d are formed along the y-direction. Gate structures 230a, 230b are formed along the x-direction over the fin structures 228a, 228b, 228c, 228d. Each of the fin structures 228a, 228b, 228c, 228d includes two or more nano-sheet semiconductor channels 228. FIG. 3B schematically illustrates positions of the fin structures 228a, 228b, 228c, 228d prior to formation of source/drain features. During fabrication, portions of the fin structures 228a, 228b, 228c, 228d not covered by the gate structures 230a, 230b are etched back, and epitaxial source/drain structures are then formed on both sides of the gate structures 230a, 230b to form the transistors.

The fin structures 228a, 228d are formed over the two p-wells 226p respectively. The fin structures 228a, 228d may have a width w1 along the x-direction. The fin structures 228b, 228c are formed over the n-well 226n. The fin structure 228b, 228c may have a width w2 along the x-direction. In some embodiments, the width w1 is greater than the width w2. In some embodiments, in an array of bit cells 102, the fin structures 228a, 228d are formed continuously along the y-direction, and the fin structures 228b, 228c are formed in sections in each bit cell 102. The pull-down transistor 118 and pass transistor 126 are n-type transistors formed over one p-well 226p, and the pull-down transistor 124 and pass transistor 128 are n-type transistors formed over the other p-well 226p. The pull-up transistors 114 and 122 are p-type transistors formed over the n-well 226n. Gates of the pull-down transistor 118 and the pull-up transistor 114 are connected. Gates of the pull-down transistor 124 and the pull-up transistor 122 are connected.

As shown in FIG. 3A, the transistors in the bit cell 102 are GAA transistors having two or more vertically stacked semiconductor channels 228. The gate structure 230a, 230b includes a gate dielectric layer 231 and a gate electrode layer 232 formed around each of two or more semiconductor channels 228. The gate structure 230a is formed over the pull-down transistor 118, the pull-up transistor 114, and the pass transistor 128, and is cut into two portions by a gate isolator 236 between the pull-up transistor 114 and the pass transistor 128. Similarly, the gate structure 230b is formed over the pass transistor 126, the pull-up transistor 122, and the pull-down transistor 124, and is cut into two portions by another gate isolator 236 between the pass transistor 126 and the pull-up transistor 122.

Figure 3C:
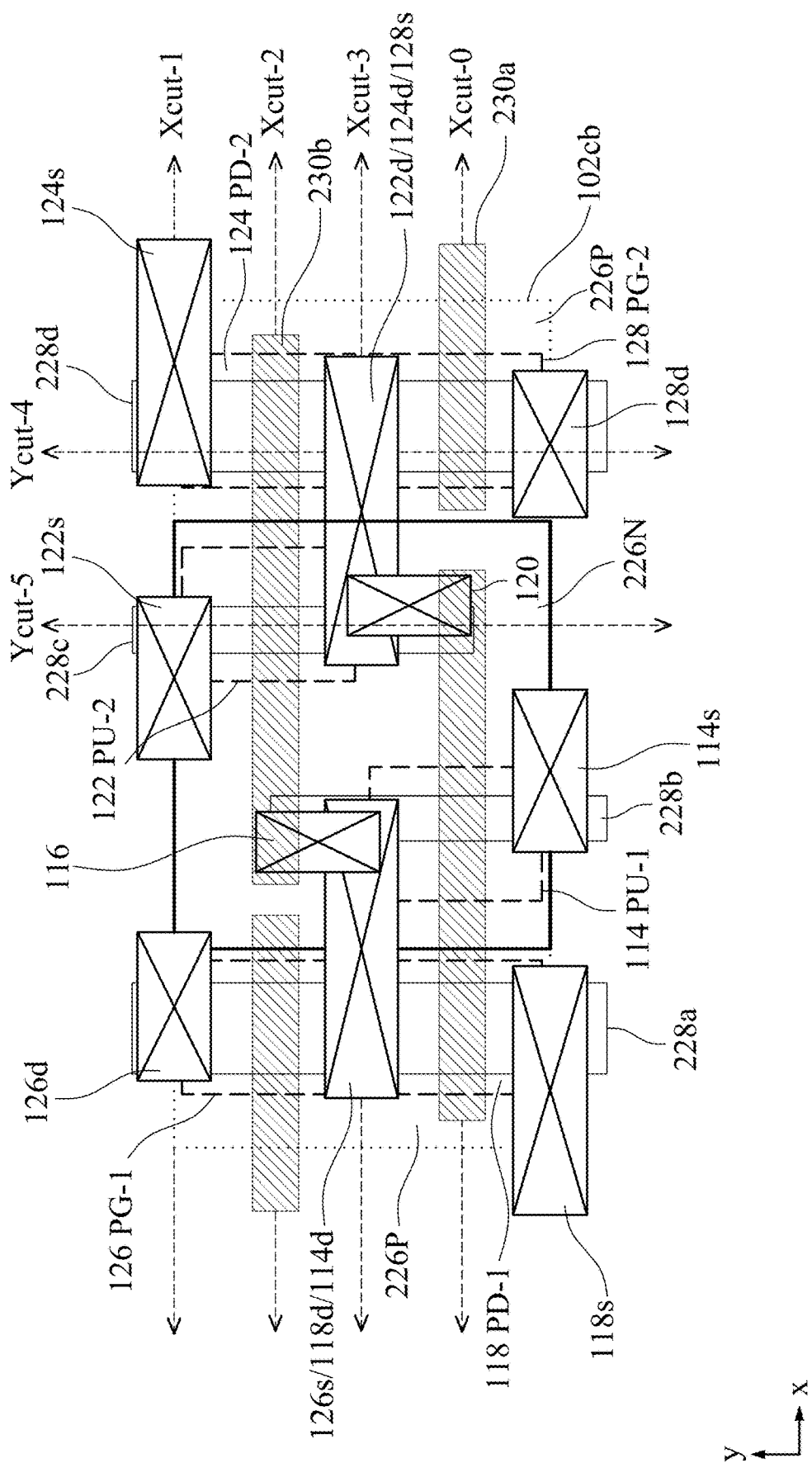

FIG. 3C is a schematic layout of the source/drain contact features and gate contact features in the bit cell 102 of FIG. 3A according to one embodiment of the present disclosure. Source/drain contact features 114s, 114d, 118s, 118d, 122s, 122d, 124s, 124d, 126s, 126d, 128s, 128d are formed over on source/drain features of the transistors 114, 118, 122, 124, 126, 128. In some embodiments, the source/drain contact features 126s, 118d, 114d are connected to one another, and the source/drain contact features 122d, 124d, 128s are connected to one another. The node 116 connects the gates of the pull-down transistor 124 and the pull-up transistor 122 to the source/drain contact features 126s, 118d, 114d. The node 120 connects the gates of the pull-down transistor 118 and the pull-up transistor 114 to the source/drain contact features 122d, 124d, 128s.

Figure 3D:
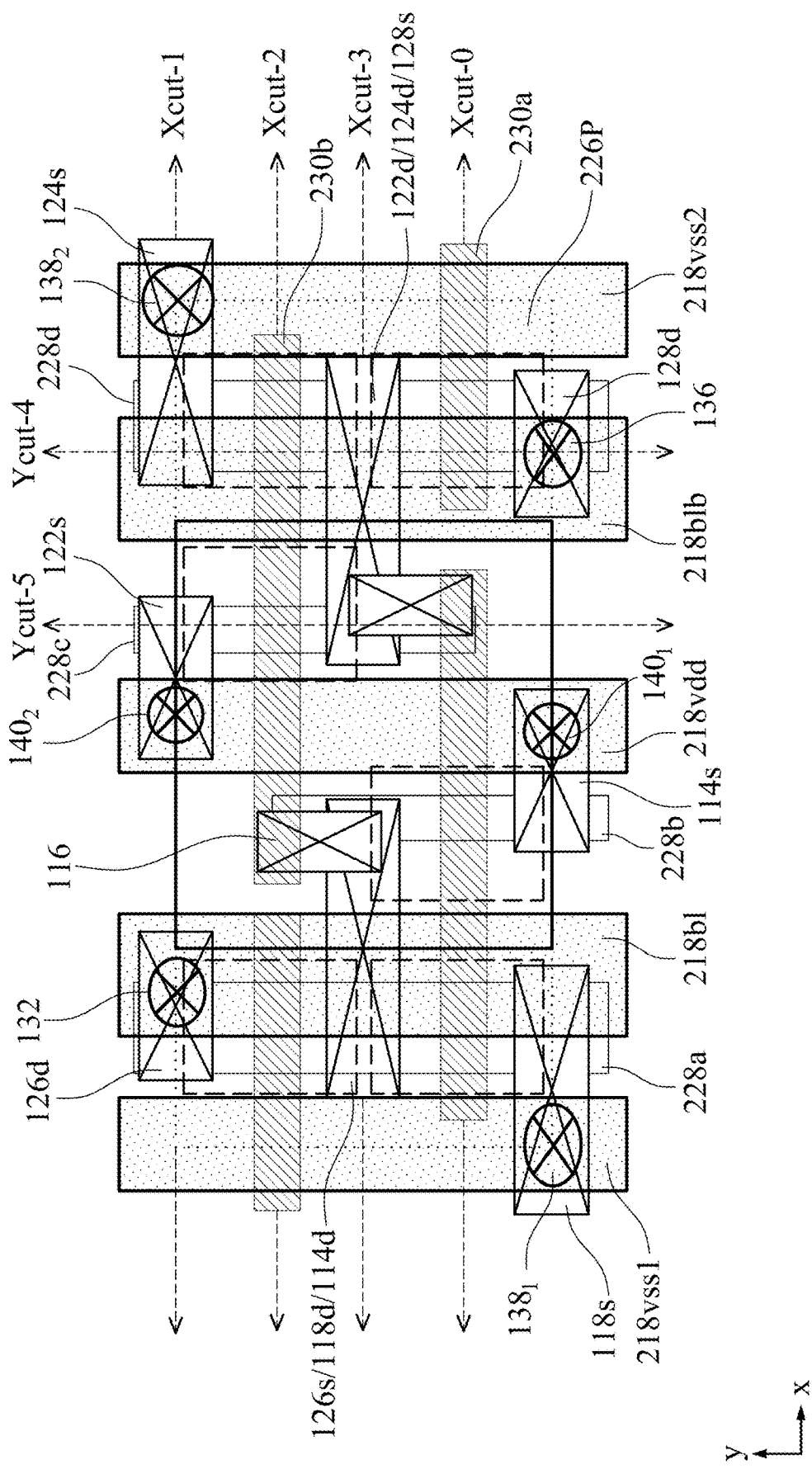

FIG. 3D is a schematic layout of the first conductive layer 218 formed in the front side IMD layer 212 of the bit cell 102 of FIG. 3A. As discussed above, the first conductive layer (or M1) 218 includes bit lines and conductive features for connecting the bit cell 102 to the low-voltage power source VSS and the high-voltage power source VDD.

The conductive layer 218 includes conductive routing lines 218vss1, 218bl, 218vdd, 218blb, and 218vss2 arranged along the y-direction. The conductive routing lines 218vss1, 218bl, 218cvdd, 218blb, and 218vss2 are substantially parallel to one another. The conductive routing lines 218vss1, 218vss2 are configured to connect to a power mesh to the low-voltage source VSS. The conductive routing line 218vdd is to be connected to the high-voltage source VDD. The conductive routing line 218bl is the bit line BL, and the conductive routing line 218blb is the bit line BLB.

As shown in FIG. 3D, the conductive routing line 218vdd to be connected to the high-voltage source VDD is positioned near the center of the bit cell 102. The conductive routing lines 218vss1, 218vss2 may be disposed at the cell boundary 102cb of the bit cell 102. The conductive routing line 218bl/the bit line BL is disposed between the low-voltage power supply line/conductive routing lines 218vss1 and the high-voltage power supply line/conductive routing line 218vdd. The conductive routing line 218blb/the complementary bit line BLB is disposed between the low-voltage power supply line/conductive routing line 218vss2 and the high-voltage power supply line/conductive routing line 218vdd. This arrangement allows the high voltage power supply line/conductive routing line 218vdd to separate bit lines BL and BLB.

The nodes 132, 136, 138$_1$, 138$_2$, 140$_1$, 140$_2$ in FIG. 1B may be implemented in form of conductive vias to connect the conductive layer 218 and the source/drain contact features 114s, 118s, 122s, 124s, 126d, 128d. As shown in FIG. 3D, the node 132 couples the source/drain contact feature 126d of the pass transistor 126 to the bit line BL, and the node 136 couples the source/drain contact feature 128d of the pass transistor 128 to the complementary bit line BLB. The nodes 138$_1$, 138$_2$ couple the pull-down transistors 118 and 124 to the low-voltage source VSS through the conductive routing lines 218vss1, 218vss2 respectively. The nodes 140$_1$, 140$_2$ couple the pull-up transistors 114 and 122 to the high-voltage source VDD through the conductive routing line 218vdd.

Figure 3E:
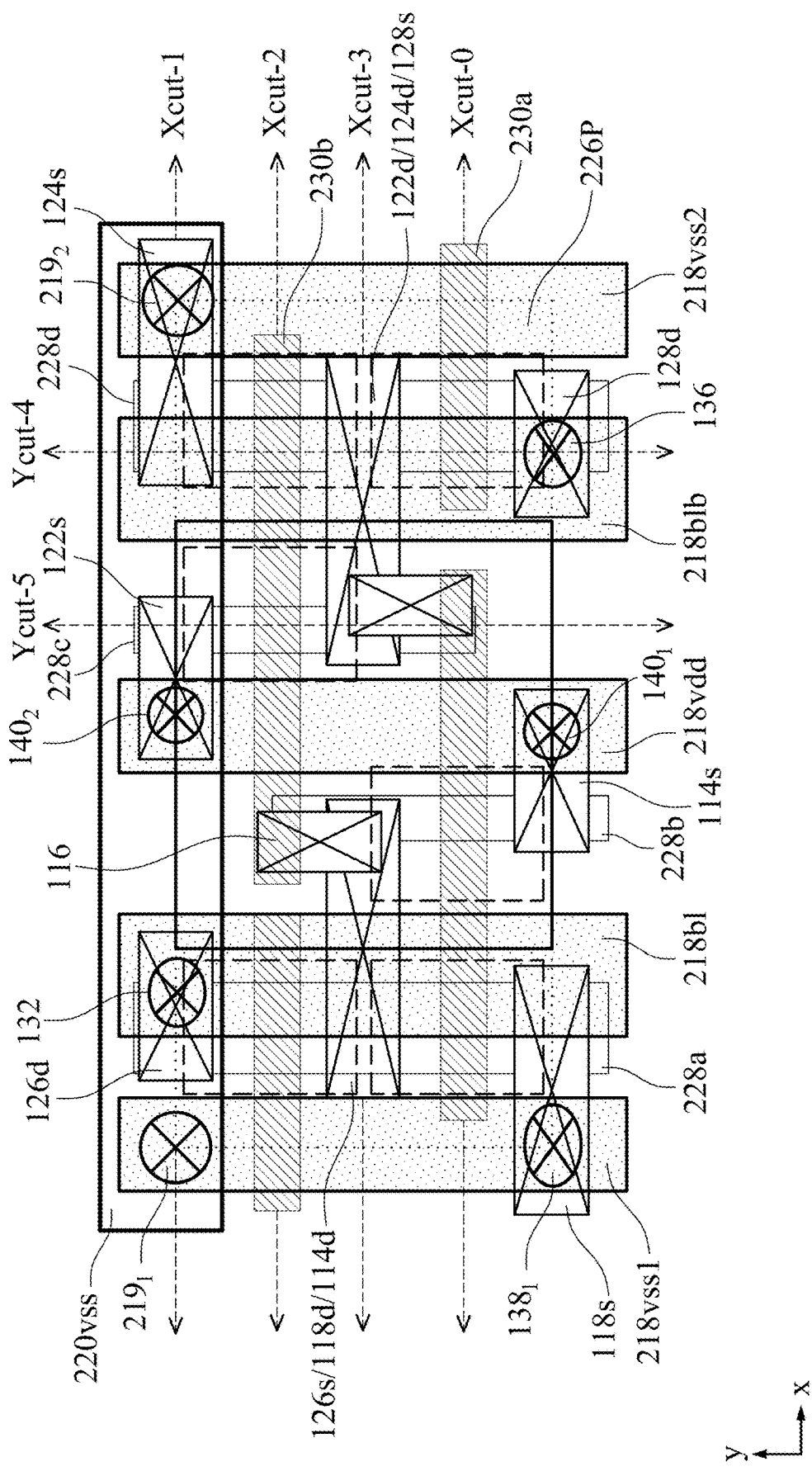

FIG. 3E is a schematic layout of the second conductive layer 220 formed in the front side IMD layer 212 of the bit cell 102 of FIG. 3A. As discussed above, the second conductive layer (or M2) 220 includes conductive features to form a power mesh to the low-voltage power source VSS. The second conductive layer 220 may include a conductive routing line 220vss to be connected to the low-voltage source VSS. In some embodiments, the conductive line 220vss may be formed along the x-direction or perpendicular to the conductive routing lines 218vss1 and 218vss2 in the first conductive layer 218. Conductive vias 2191, 2192 are used to connect the conductive routing lines 218vss1 and 218vss2 to the conductive routing line 220vss. In some embodiments, additional conductive layers may be formed over the second conductive layer 220 as a power mesh to the low-voltage power source VSS.

Figure 3F:
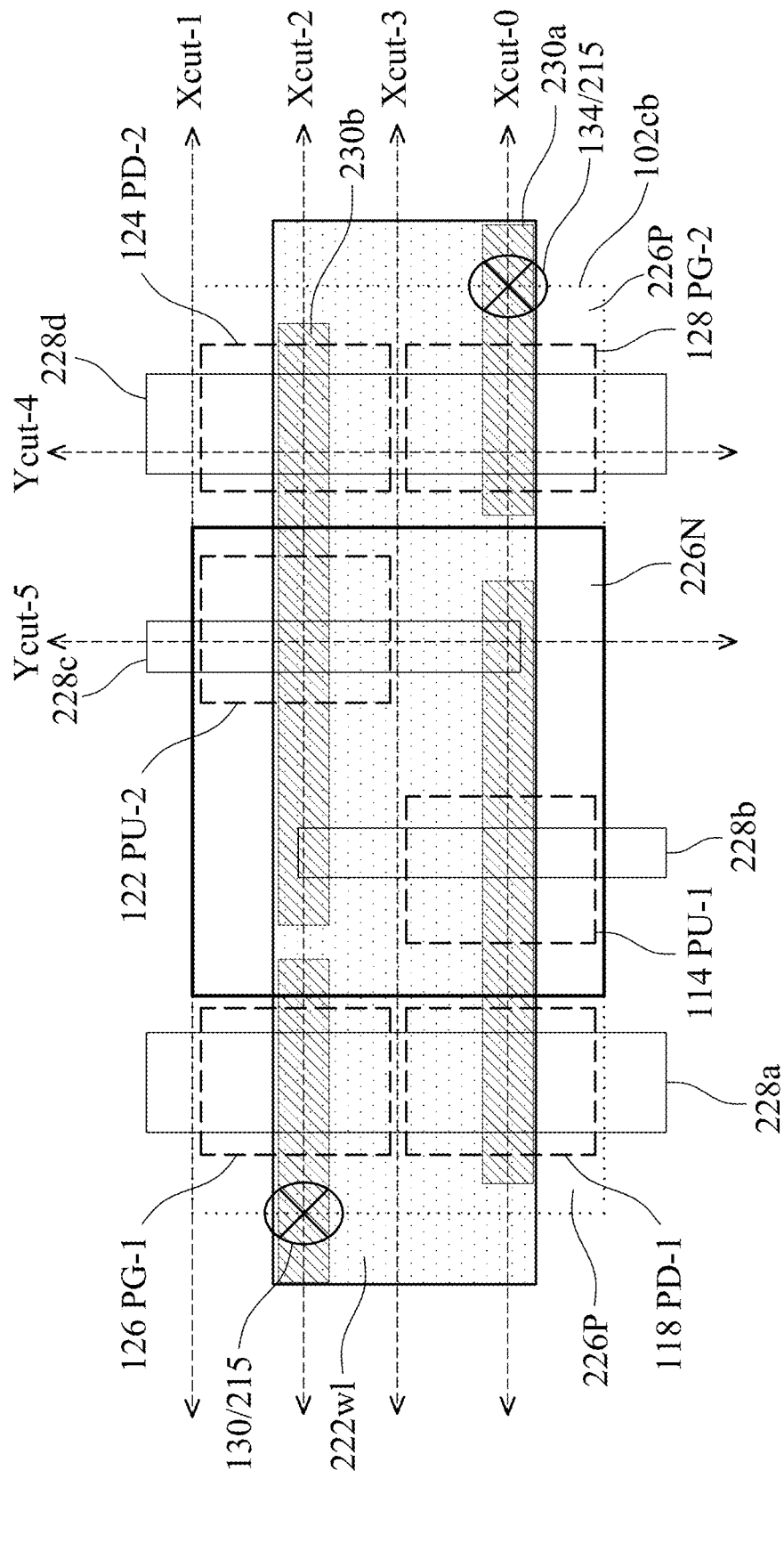

FIG. 3F is a schematic layout of the first conductive layer 222 formed in the back side IMD layer 216 of the bit cell 102 of FIG. 3A. As shown in FIG. 3F, the first conductive layer (or BM1) 222 includes a conductive line 222wl extending across the bit cell 102 along the x-direction. The conductive line 222wl is a word line. The conductive line 222wl is connected to the gate of the pass transistor 126 at the node 130. The conductive line 222wl is connected to the gate of the pass transistor 128 at the node 134. The nodes 130, 134 may be implemented by conductive vias 215 formed in the backside dielectric layer 214. By positioning the word line on the back side of the transistor layer, the conductive line 222wl/word line may have a width along the y-direction that extends across both of the gate structures 230a, 230b, thus, reducing resistance of the word line.

Figure 3G:
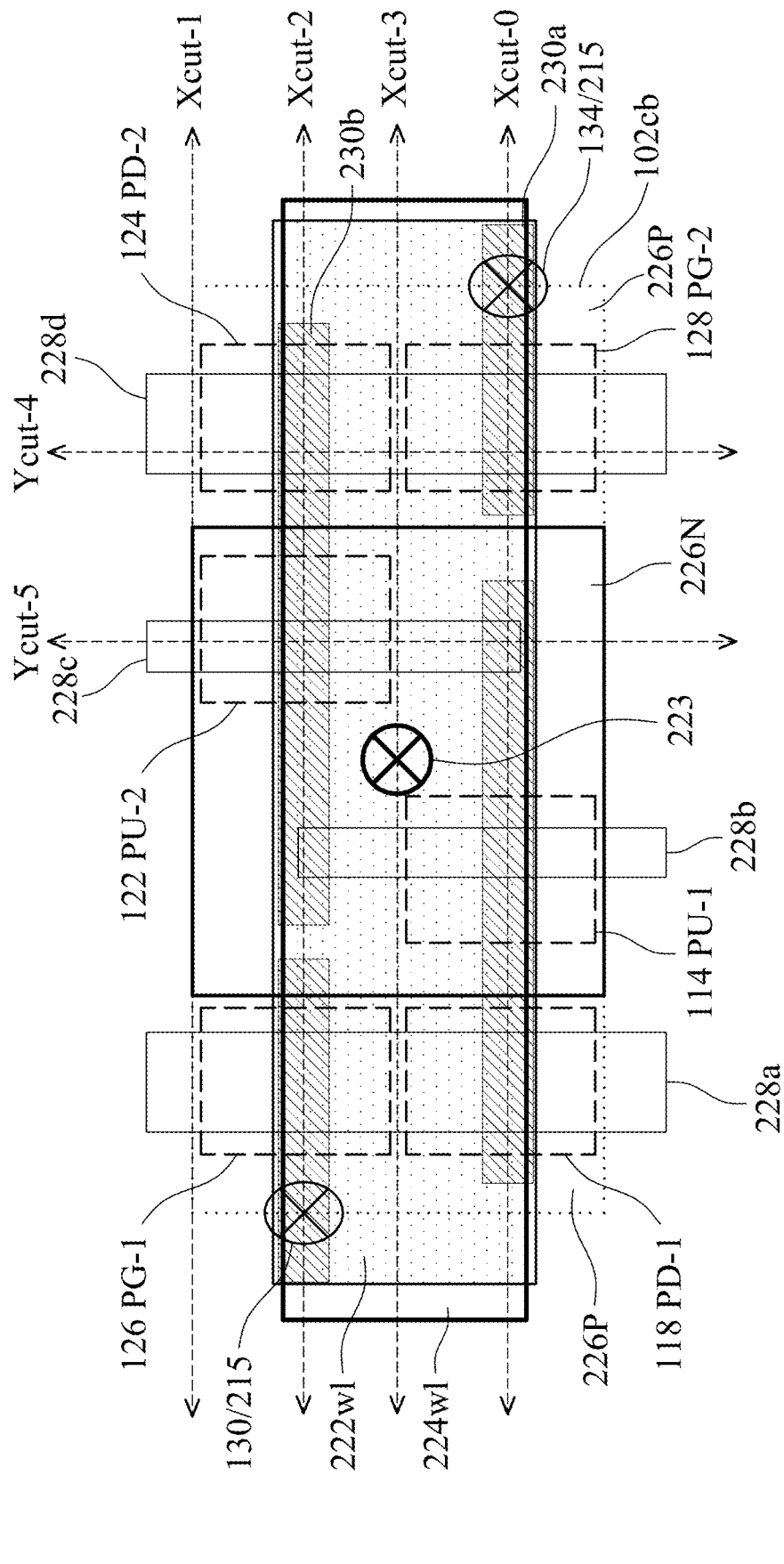

FIG. 3G is a schematic layout of the second conductive layer 224 formed in the back side IMD layer 216 of the bit cell 102 of FIG. 3A. The second conductive layer (or BM2) 224 includes a second word line electrically connected to the word line in the first conductive layer (or BM1) 222. The second conductive layer (or BM2) 224 includes a conductive line 224wl extending across the bit cell 102 along the x-direction. The conductive line 224wl may be connected to the conductive line 222wl by one or more conductive vias 223. The conductive line 222wl and the conductive line 224wl are parallelly connected, thus, further, reducing resistance of the word line. In some embodiments, the second conductive layer 224 may be omitted. In other embodiments, additional back side conductive layer may be formed to include more conductive lines to further reduce the resistance of the word line.

Figure 3H:
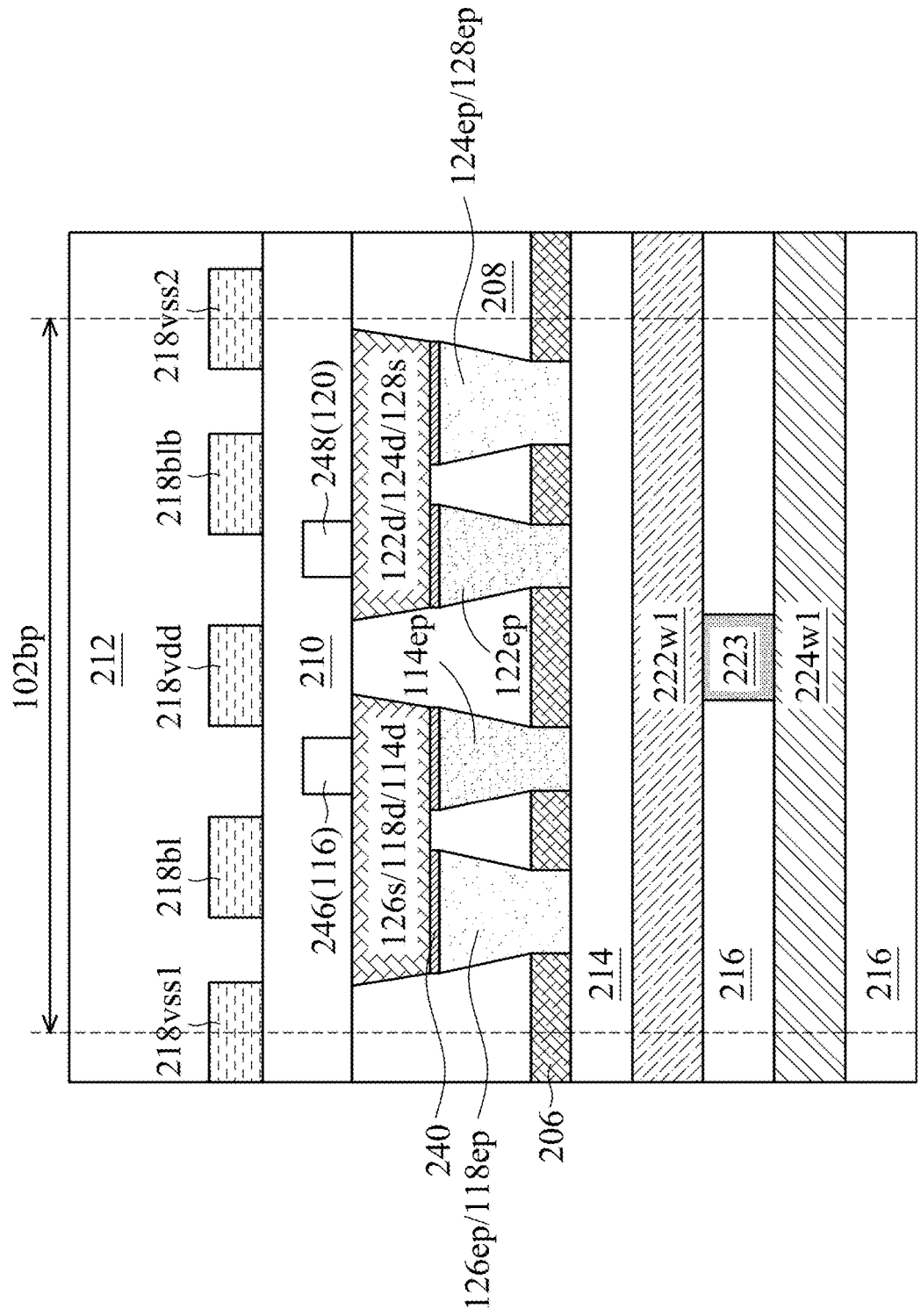
Figure 3I:
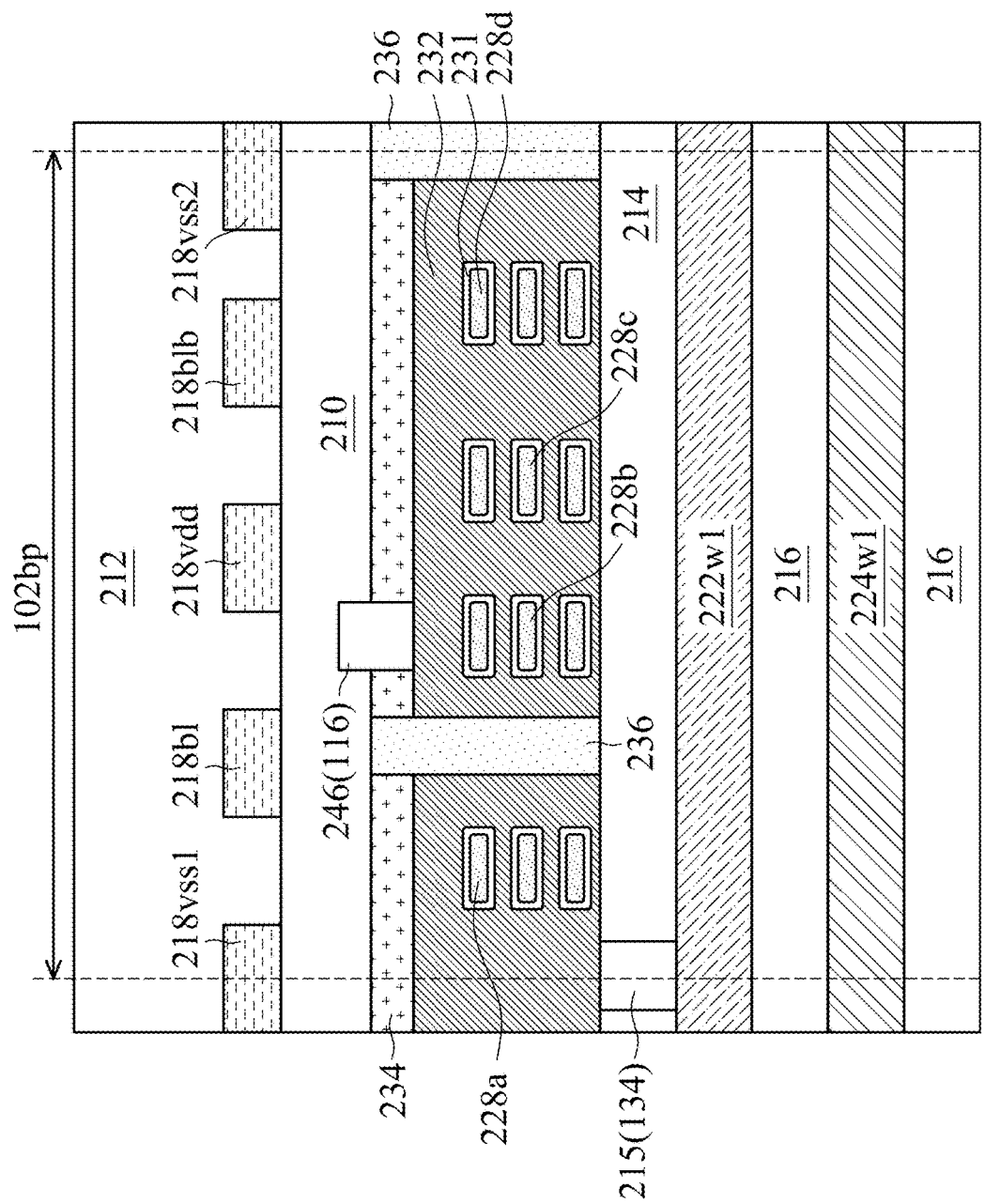
Figure 3K:
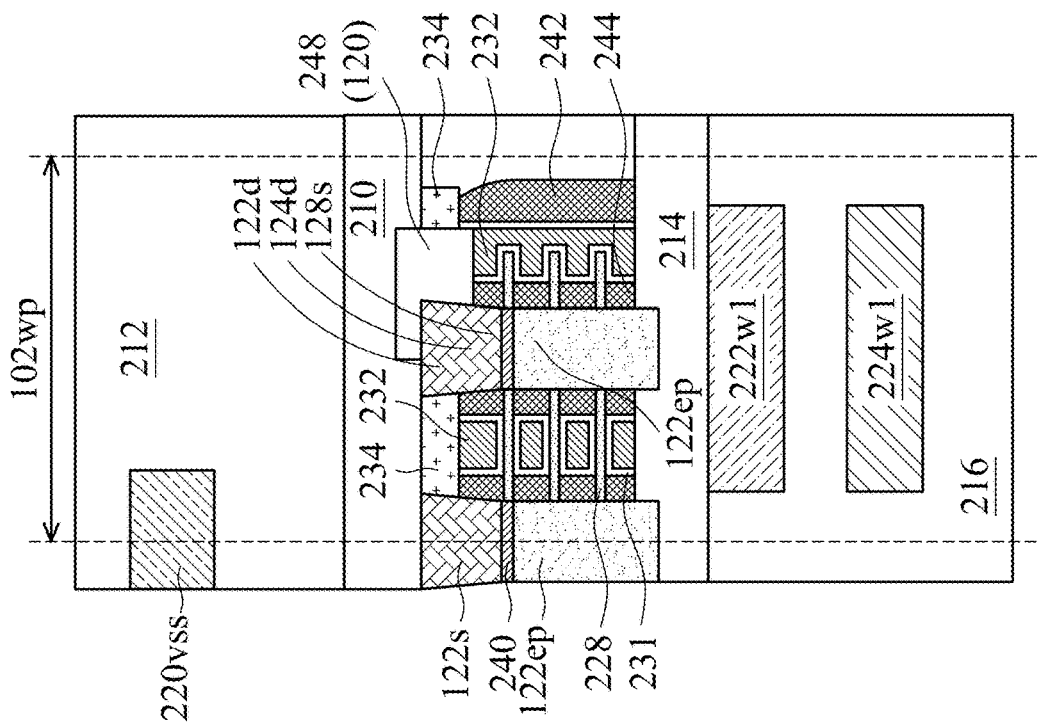
Figure 3J:
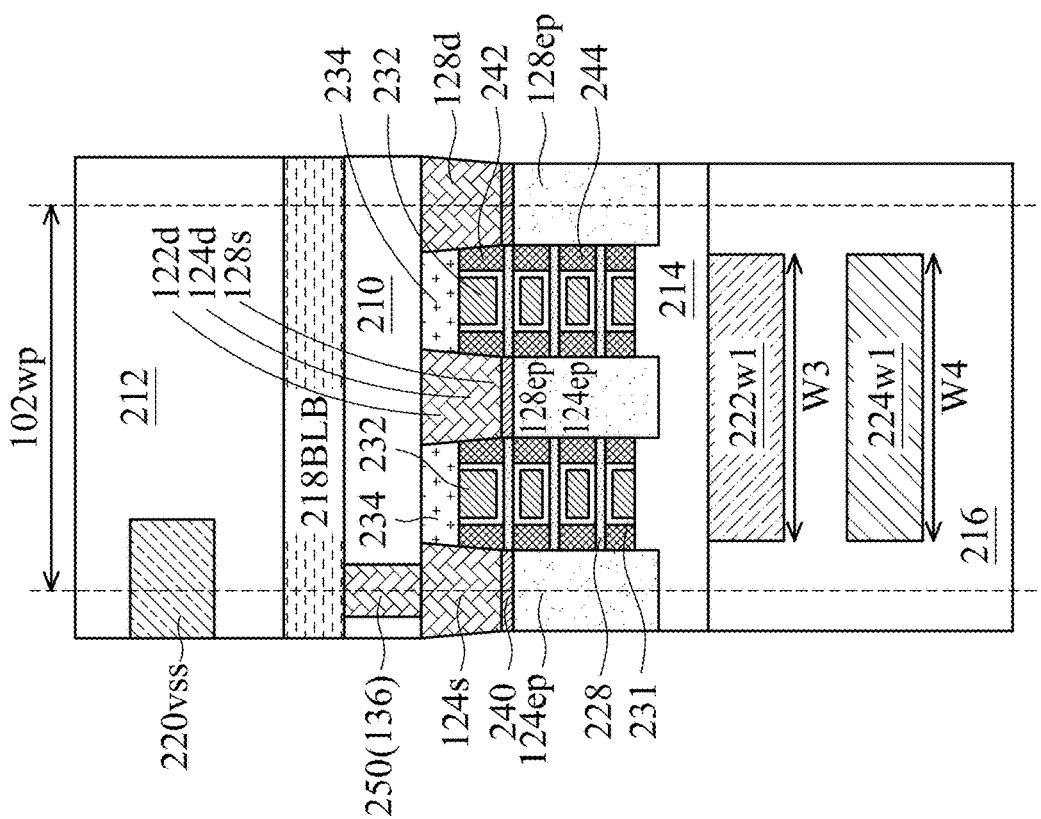
Figure 3L:
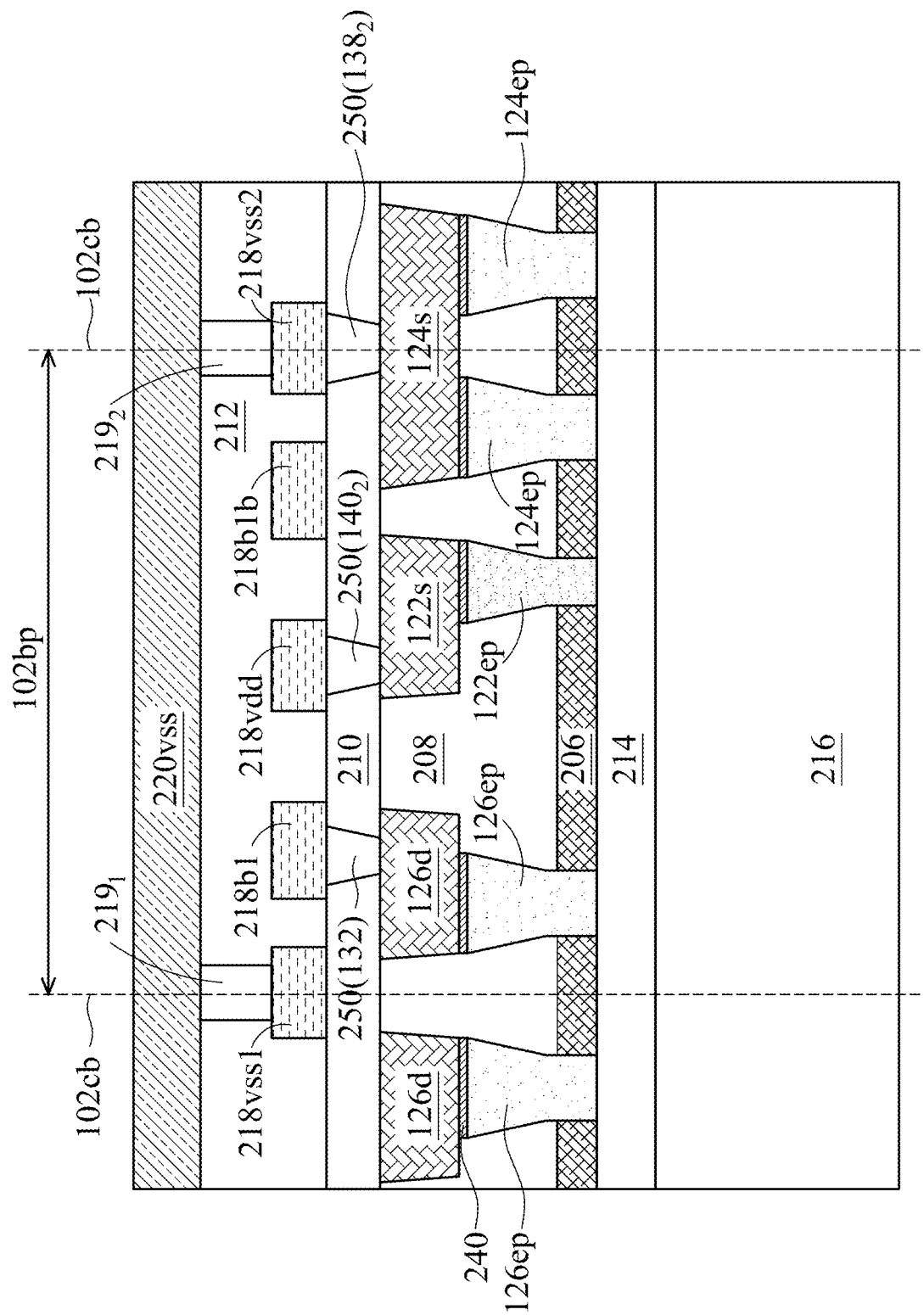

FIGS. 3H-3L are various sectional views of the bit cell 102 showing detailed structures. FIG. 3H is a sectional view of the bit cell 102 along the line of xcut-3 in FIG. 3B. Particularly, FIG. 3H is a sectional view of between the gate structures 230a, 230b and parallel to the gate structures 230a, 230b. FIG. 3I is a sectional view of the bit cell 102 along the line of xcut-2 in FIG. 3B. Particularly, FIG. 3I is a sectional view along the gate structure 230b. FIG. 3J is a sectional view of the bit cell 102 along the line of Ycut-4 in FIG. 3B. Particularly, FIG. 3J is a sectional view along the fin structure 228d across the gate structures 230a, 230b. FIG. 3K is a sectional view of the bit cell 102 along the line of Ycut-5 in FIG. 3B. Particularly, FIG. 3K is a sectional view along the fin structure 228c across the gate structures 230a, 230b. FIG. 3L is a sectional view of the bit cell 102 along the line of xcut-1 in FIG. 3B. Particularly, FIG. 3L is a sectional view along the long edge of the cell boundary 102cb.

The sectional views in FIGS. 3H-3L expand over the cell boundary 102cb of the bit cell 102 to show a portion of the neighboring bit cells 102 in a memory array. In some embodiments, the neighboring bit cells 102 are mirror images of each other. The conductive routing lines 218vss1, 218vss2 are formed on two short edges of the cell boundary 102cb and shared by two neighboring bit cells 102. The conductive routing line 220vss is formed on one long edge of the cell boundary 102cb and shared by the bit cells 102 on both sides of the cell boundary 102cb.

As shown in FIGS. 3H-3L, each of the transistors 114, 118, 122, 124, 126, 128 includes two epitaxial source/drain features 114ep, 118ep, 122ep, 124ep, 126ep, 128ep formed on two ends of two or more semiconductor channels 228. The gate dielectric layer 231 and the gate electrode layer 232 are formed around each of the semiconductor channels 228. Sidewall spacers 242 and inner spacers 244 are formed between the epitaxial source/drain features 114ep, 118ep, 122ep, 124ep, 126ep, 128ep and the gate dielectric layer 231. A self-aligned contact layer 234 is formed over the gate electrode layer 232 to provide electrical isolation to the gate electrode layer 232 and alignment for subsequent gate contact formation.

The ILD layer 208 is formed over the epitaxial source/drain features 114ep, 118ep, 122ep, 124ep, 126ep, 128ep to provide electrical isolation. A contact etch stop layer (CESL), not shown, is typically formed between the epitaxial source/drain features 114ep, 118ep, 122ep, 124ep, 126ep, 128ep and the ILD layer 208. The contact features 114s, 114d, 118s, 118d, 122s, 122d, 124s, 124d, 126s, 126d, 128s, 128d are formed in the ILD layer 208 on a front side of the epitaxial source/drain features 114ep, 118ep, 122ep, 124ep, 126ep, 128ep in each of the transistors 114, 118, 122, 124, 126, 128. In some embodiments, a silicide layer 240 is formed between the epitaxial source/drain features 114ep, 118ep, 122ep, 124ep, 126ep, 128ep and the corresponding contact features.

A front gate contact 246 (also referred to as butt contact, corresponding to the node 116) connects the gates of the pull-down transistor 124 and the pull-up transistor 122 to the source/drain contact features 126s, 118d, 114d. A front gate contact 248 (also referred to as butt contact, corresponding to the node 120) connects the gates of the pull-down transistor 118 and the pull-up transistor 114 to the source/drain contact features 122d, 124d, 128s.

The ILD layer 210 is formed over the ILD layer 208, the front gate contact features 246, 248, and the source/drain contact features 114s, 114d, 118s, 118d, 122s, 122d, 124s, 124d, 126s, 126d, 128s, 128d. Conductive vias 250 are formed in the ILD layer 210 to selectively connect the source/drain contact features 114s, 114d, 118s, 118d, 122s, 122*d*, 124*s*, 124*d*, 126*s*, 126*d*, 128*s*, 128*d* to the conductive routing lines in the first conductive layer 218 embedded in the front side IMD layer 212. Particularly, one of the conductive via 250 (corresponding to the node 132) connects the source/drain contact feature 126*d* to the conductive routing line 218*bl* (corresponding to BL); one of the conductive via 250 (corresponding to the node 136) connects the the source/drain contact feature 128*d* to the conductive routing line 218*blb* (corresponding to BLB). Two conductive vias 250 (corresponding to the nodes $138_1$, $138_2$) connect the pull-down transistors 118 and 124 to the low-voltage source VSS through the conductive routing lines 218*vss*1, 218*vss*2 respectively. Two conductive vias 250 (corresponding to the nodes $140_1$, $140_2$) couple the pull-up transistors 114 and 122 to the high-voltage source VDD through the conductive routing line 218*vdd*.

The conductive routing line 220*vss*, as part of the VSS power mesh, is form in the second conductive layer 220 in the front side IMD layer 212. In some embodiments, the conductive routing line 220*vss* is formed along the x-direction, i.e. along a direction perpendicularly to the conductive routing lines 218*vss*1 and 218*vss*2 in the first conductive layer 218. In some embodiments, the conductive routing line 220*vss* is formed on the cell boundary 102*cb* and shared by two neighboring bit cells 102. The conductive vias 2191, 2192 are formed in the front side IMD layer 212 between the first conductive layer 218 and the second conductive layer 220 to connect the conductive routing lines 218*vss*1 and 218*vss*2 to the conductive routing line 220*vss*.

The back side dielectric layer 214 may be formed by replacing the substrate on which the fin structures 228*a*, 228*b*, 228*c*, 228*d* and the epitaxial source/drain features 114*ep*, 118*ep*, 122*ep*, 124*ep*, 126*ep*, 128*ep* are formed. The backside dielectric layer 214 is contact with a back side of the epitaxial source/drain features 114*ep*, 118*ep*, 122*ep*, 124*ep*, 126*ep*, 128*ep*, the STI layer 206, the gate dielectric layer 231, the inner spacers 244, and the gate spacer 242. The back side gate contact features 215 may be formed in an opening through the back side dielectric layer 214 and the gate dielectric layer 231 to connect the gate electrode layer 232.

The back side IMD layer 216 is formed below the back side dielectric layer 214. The first conductive layer (or BM1) 222 including the conductive line 222*wl*, which functions as the word line, is formed in the back side IMD layer 216. The back side gate contact features 215 (corresponding to the nodes 130 and 134) connects the gate electrode layer 232 to the conductive line 222*wl*. As shown in FIGS. 3F and 3I, the back side gate contact features 215 may be formed on the short edge of the cell boundary 102*cb*.

The conductive line 222*wl* extends across the bit cell 102 along the x-direction. The conductive line 222*wl* may be positioned below the gate structures 230*a*, 230*b*. The conductive line 222*wl* may have a width w3 along the y-direction. In some embodiments, a ratio of the w3 over the word pitch or the cell width 102*wp* in a range between about 40% and 80%. A ratio lower than 40% may not be wide enough to have enough overlapping with the gate structures 230*a*, 230*b* establish connection through the contact features 215, or not enough resistance reducing benefit. A ratio higher than 80% may not have enough spacing for dielectric material between neighboring word lines to conform with design rules.

Optionally, the second conductive layer (or BM2) 224 including the conductive line 224*wl*, which also functions as the word line, is formed below the first conductive layer 222 in the back side IMD layer 216. The conductive via 223 is formed between the first and second conductive layers 222, 224 to connect the conductive lines 222*wl* and 224*wl*. In some embodiments, the conductive via 223 may be formed near the central portion of the bit cell 102. The conductive line 224*wl* may have a width w4 along the y-direction. In some embodiments, a ratio of the w4 over the word pitch or the cell width 102*wp* in a range between about 40% and 80%. A ratio lower than 40% may not be wide enough to have enough resistance reducing benefit. A ratio higher than 80% may not have enough spacing for dielectric material between neighboring word lines to conform with design rules.

Figure 4:
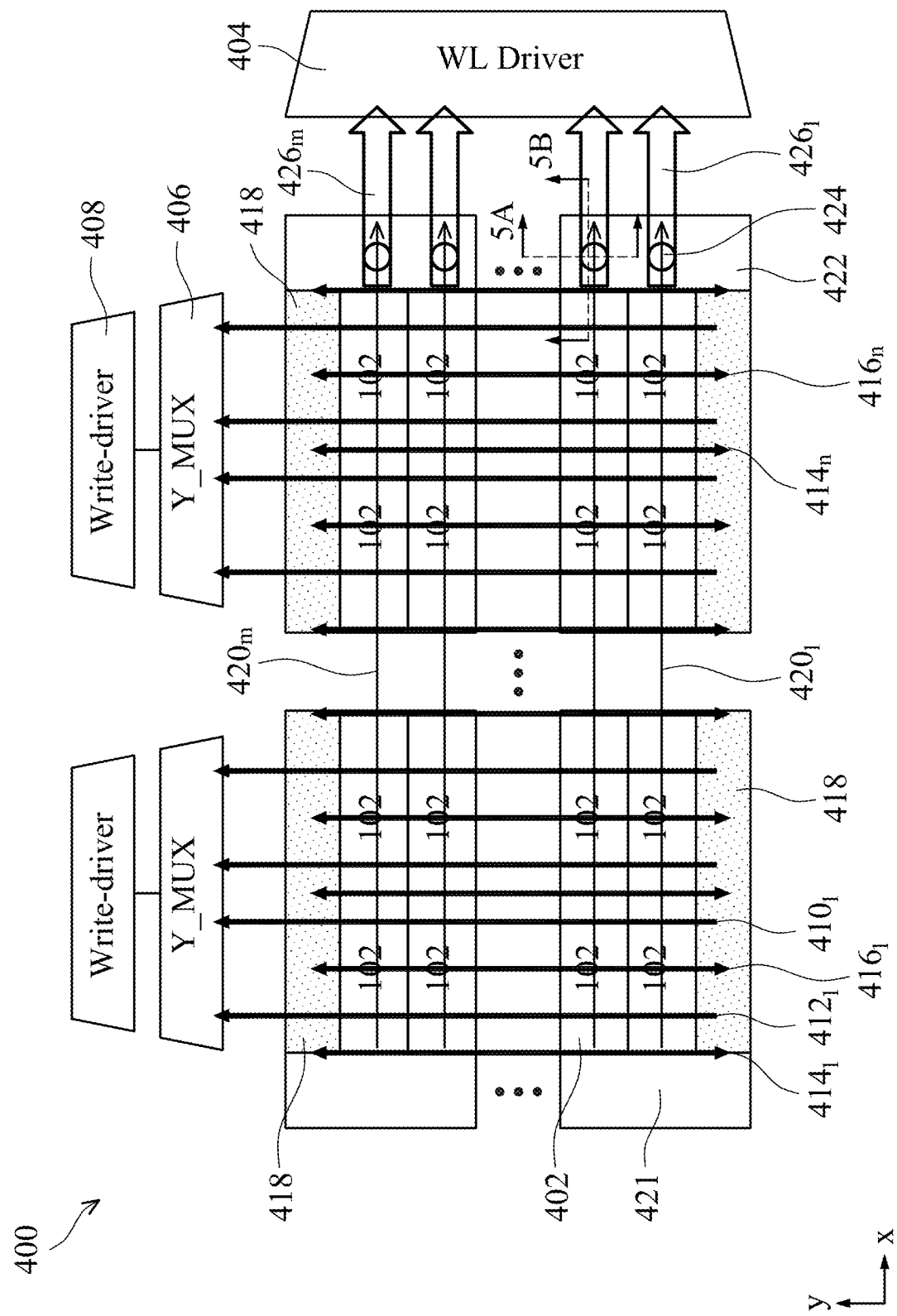
FIG. 4 is a schematic diagram of a memory circuit according to embodiments of the present disclosure.

FIG. 4 is a block diagram of a memory circuit 400 according to embodiments of the present disclosure. In some embodiments, the memory circuit 400 may be used in place of the memory circuit 20 in the integrated circuit 10 of FIG. 1. The memory circuit 400 may include a memory cell array 402, a word line decoder 404, a multiplexer 406, and a write driver 408. In some embodiments, the memory cell array 402, the word line decoder 404, the multiplexer 406, and the write driver 408 are formed on the same substrate. The word line decoder 404, the multiplexer 406, and the write driver 408 are periphery circuit to the memory cell array 402 and configured to facilitate read and write operation to each bit cell 102 in the memory cell array 402. In some embodiments, the word line decoder 404, the multiplexer 406, and the write driver 408 may be logic circuit or devices including components such as inverters, NAND gates, NOR gates, flip-flops, or combinations thereof.

The memory cell array 402 includes an array of bit cells, such as the bit cell 102 described above. The memory cell array 402 may include m rows by n columns of the bit cells, where m is an integer corresponding to the number of rows and n is an integer corresponding to the number of columns. The memory cell array 402 further includes two rows of strap cells 418 positioned above the first row and below the last row of the bit cells 102. The memory cell array 402 further includes two column of edge cells 421, 422 positioned on two ends of each row of the bit cells 102.

The bit cells 102 in each column 1 to n share one bit line $410_1$ to $410_n$ (collectively 410), one bit line bar $412_1$ to $412_n$ (collectively 412), one low-voltage power line $414_1$ to $414_n$ (collectively 414), and one high-voltage power line $416_1$ to $416_n$ (collectively 416). The bit cells 102 in each row 1 to m share one word line $420_1$ to $420_m$ (collectively 420).

The strap cells 418 may be configured to supply bulk terminal voltages, and the low-voltage power lines 414 and the high-voltage power lines 416 are connected to the strap cells 418. The bit lines 410 and bit line bars 412 are connected to the multiplexer 406, which is further connected to the write driver 408 to read and write the value in each bit cell 102.

The word lines 420 extend across each row of the bit cells 102 from the edge cells 421 to the edge cells 422. In some embodiments, the edge cells 422 may include a word line signal line 426 ($426_1$ to $426_m$) to connect to the word line decoder 404. As disclosed above, the bit line and word line of the bit cell 102 are arranged on opposite sides of the transistors. In the example above, the word line is positioned on a backside of the bit cell 102 while the bit lines and the power supply lines are positioned on the front of the bit cell 102. In some embodiments, the word line decoder 404 are standard logic cells having signal lines formed located on the front side of the substrate, the word line signal lines 426 are located on the front side of the substrate. Each edge cell 422 may include a word line tap structure 424 configured to connect the word lines 420 located on the back side of the substrate to the word line signal lines 426 located on the front side of the substrate.

FIGS. 5A and 5B are schematical sectional views of the edge cell 422 according to embodiments of the present disclosure. FIG. 5A is a sectional view of the edge cell 422 along the line 5A-5A in FIG. 4. FIG. 5B is a sectional view of the edge cell 422 along the line 5B-5B in FIG. 4. In some embodiments, the word line signal line 426 is formed in the second conductive layer 220 in the front side IMD layer 212. The edge cell 422 includes the word line tap structure 424 electrically connecting the word line 420 on the back side to the word line signal line 426 on the front side. The word line tap structure 424 may include multiple conductors formed embedded in various layers. The components in the word line tap structure 424 may be formed in multiple operations during fabrication the bit cell 102 in the corresponding layers.

In some embodiments, the word line tap structure 424 includes a conductive tap via 430 extending from the back side conductive layer 222, wherein the word line 420 is formed in the bit cell 102, through the back side dielectric layer 214 and the STI layer 206. The conductive tap via 430 is connected to a transistor layer conductor 432 formed through the ILD layer 208. The transistor layer conductor 432 is connected to a conductive via 434 is formed through the ILD layer 210. A word line contact plate 436 is formed in the first conductive layer 218 in the front side IMD layer 212. The word line contact plate 436 may be a section of conductive line parallel to the bit lines. A contact via 438 is formed between the word line contact plate 436 and the word line signal line 426.

Figure 5D:
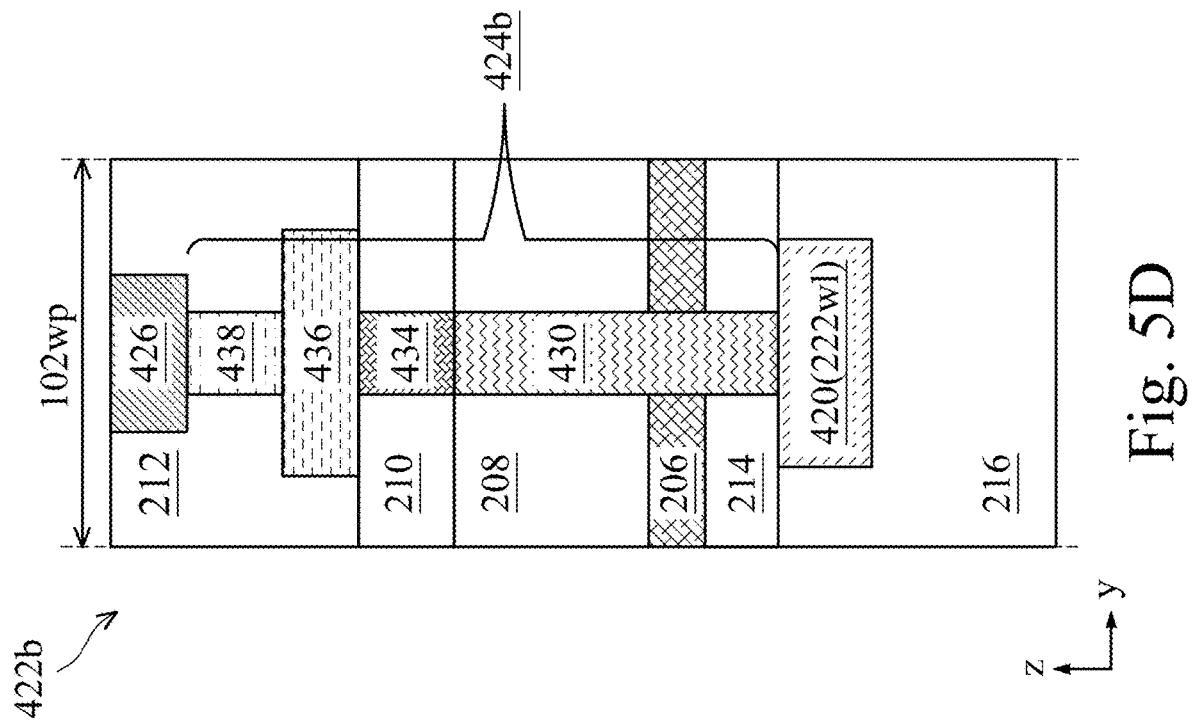
FIG. 5D is a schematic sectional view of an edge cell according to another embodiment of the present disclosure.
Figure 5C:
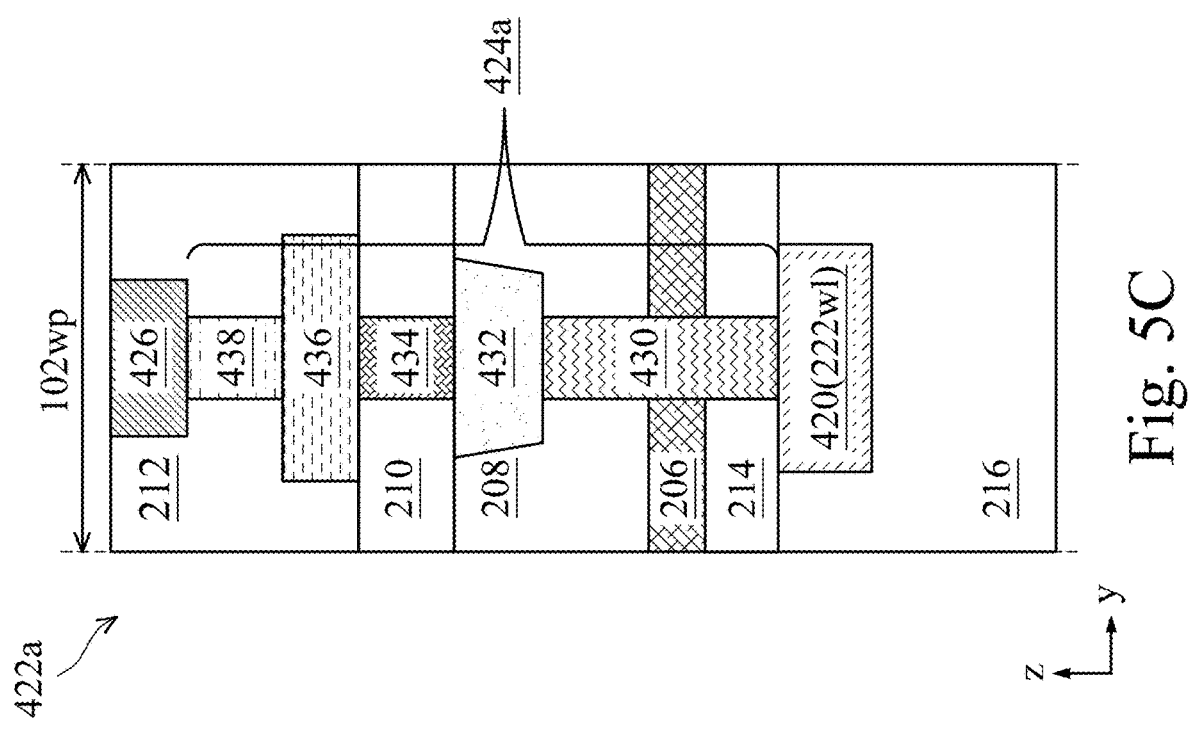
FIG. 5C is a schematic sectional view of an edge cell according to another embodiment of the present disclosure.

FIG. 5C is a schematic sectional view of an edge cell 422a according to another embodiment of the present disclosure. The edge cell 422a includes a word line tap structure 424a. The word line tap structure 424a is similar to the word line tap structure 422 of FIG. 5A except that the conductive tap via 430 extends through the back side dielectric layer 214, the STI layer 206, and part the ILD layer 208.

FIG. 5D is a schematic sectional view of an edge cell 422b according to another embodiment of the present disclosure. The edge cell 422b includes a word line tap structure 424b. The word line tap structure 424b is similar to the word line tap structure 422 of FIG. 5A except that the conductive tap via 430 extends through the back side dielectric layer 214, the STI layer 206, and the entire ILD layer 208.

Figure 5E:
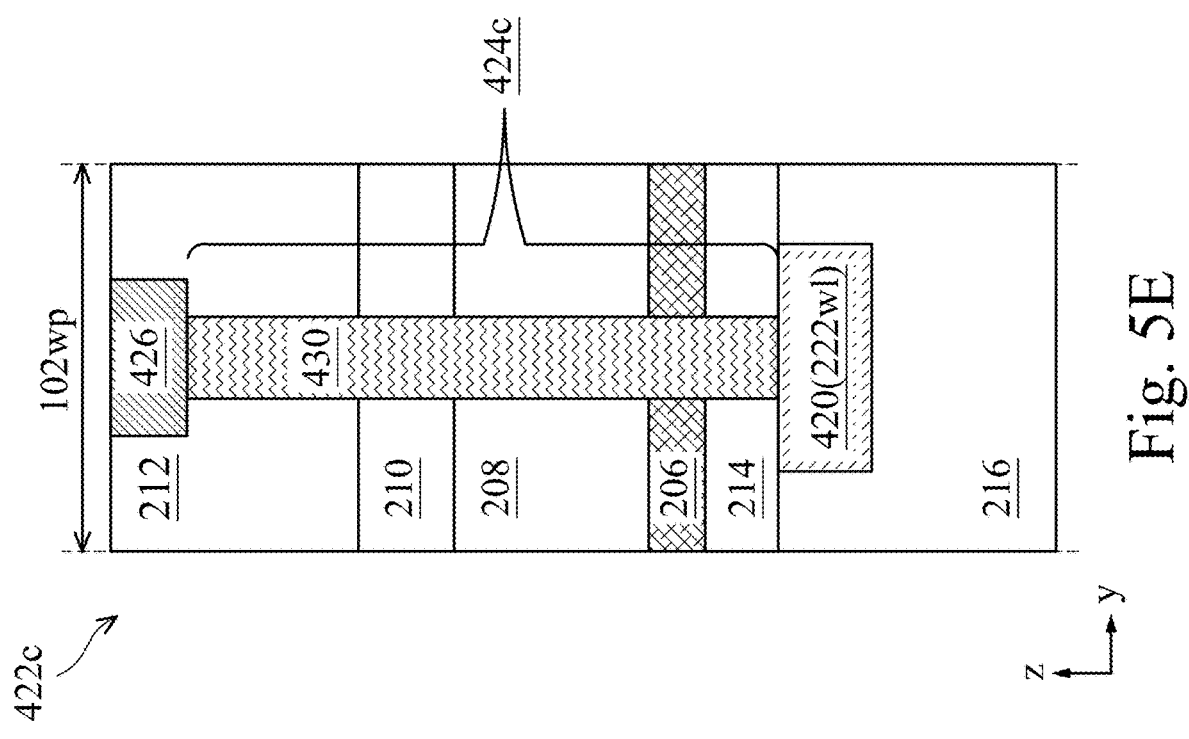
FIG. 5E is a schematic sectional view of an edge cell according to another embodiment of the present disclosure.

FIG. 5E is a schematic sectional view of an edge cell 422c according to another embodiment of the present disclosure. The edge cell 422c includes a word line tap structure 424c. The word line tap structure 424c is similar to the word line tap structure 422 of FIG. 5A except that the conductive tap via 430 extends through the back side dielectric layer 214, the STI layer 206, the ILD layer 208, and a portion of the front side IMD layer 212.

Even though the word line signal line 426 is shown to be in the second conductive layer 220 in the front side IMD layer 212, the word line 426 may be embedded other layers within the front side IMD layer 212.

Referring back to FIG. 1, the integrated circuit 10 according to the represent disclosure may include the memory circuit 20 and logic circuit 40 include GAA transistors. In some embodiments, the logic circuit 40 may include standard logic cells. Similarly, the peripheral circuits, such as word line decoders, multiplexers, write drivers, of the memory circuit 20 may include standard logic cells. In some embodiments, the integrated circuit 10 according of present disclosure includes one or more standard cells having a back side power rail.

Figure 6A:
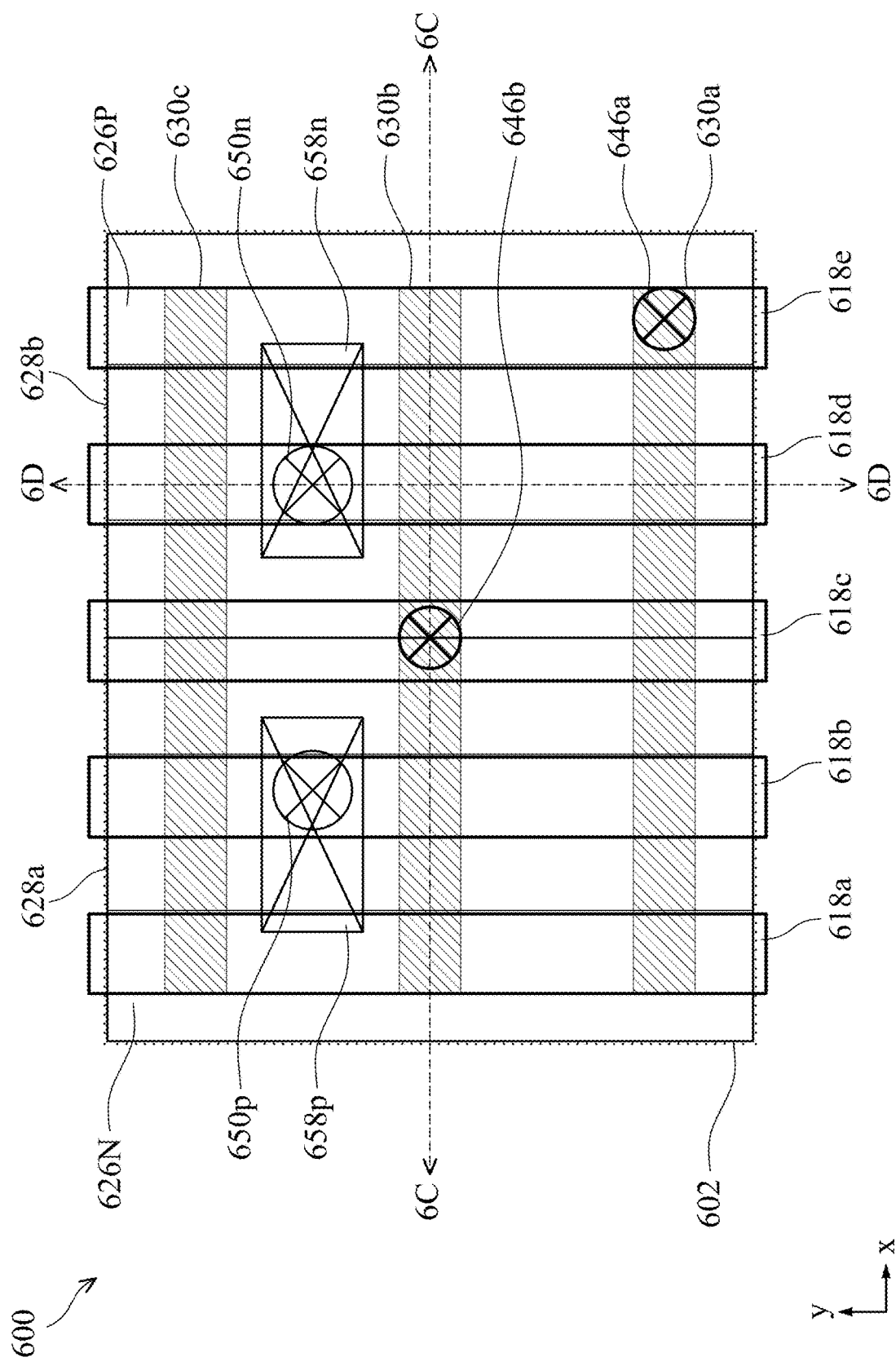
FIGS. 6A-6D are various views of a standard logic cell according to embodiments of the present disclosure.
Figure 6B:
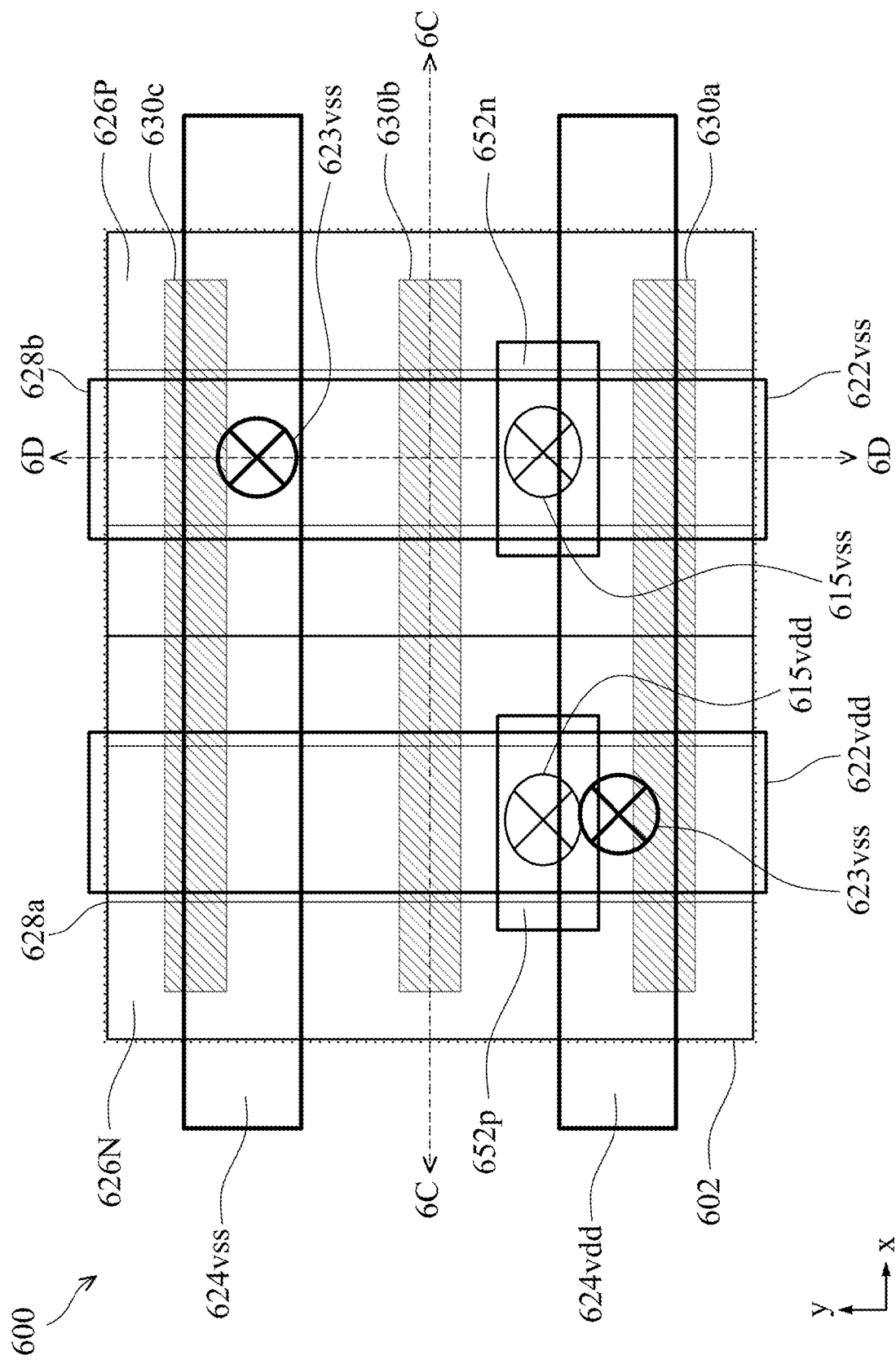
Figure 6C:
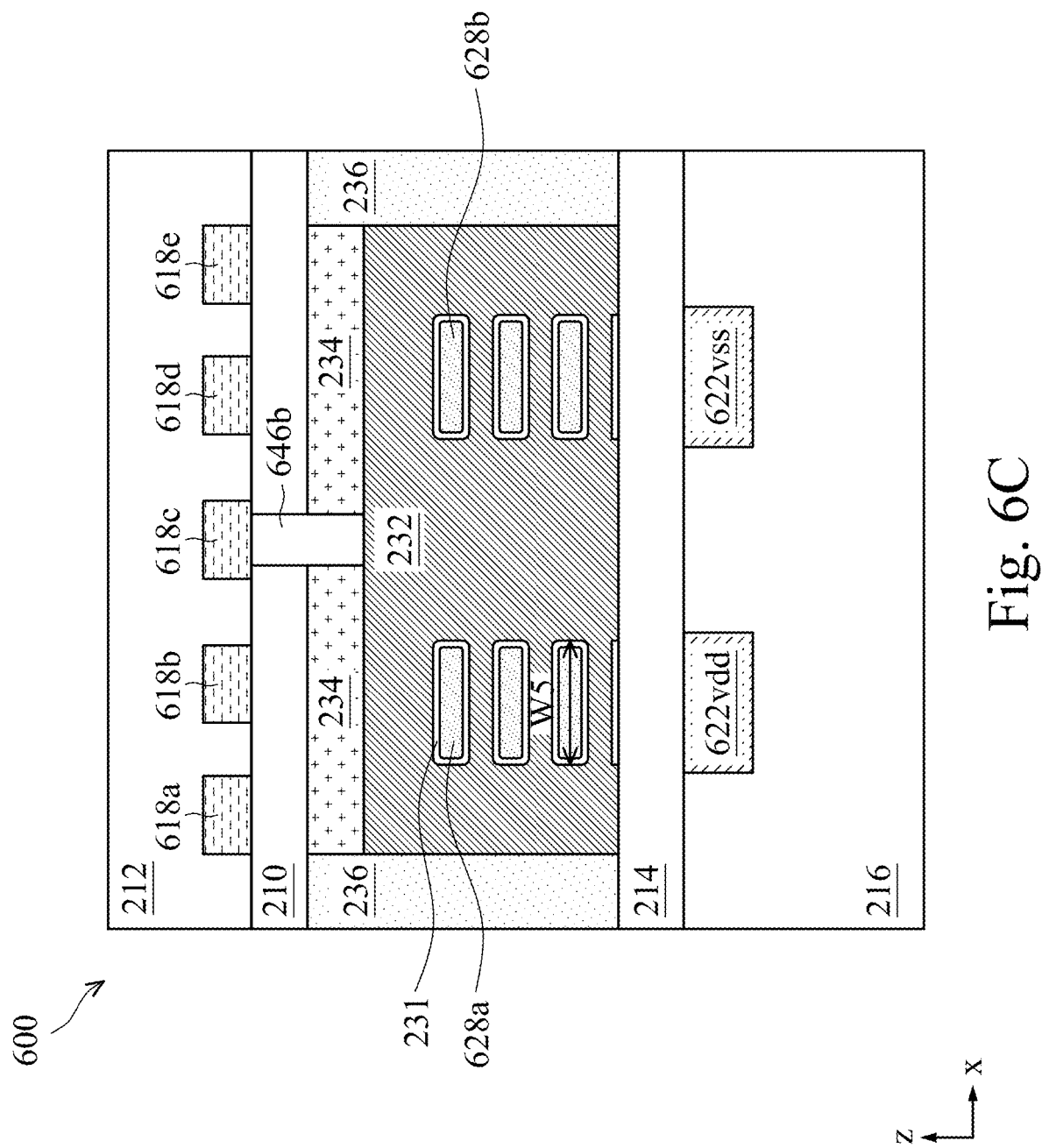
Figure 6D:
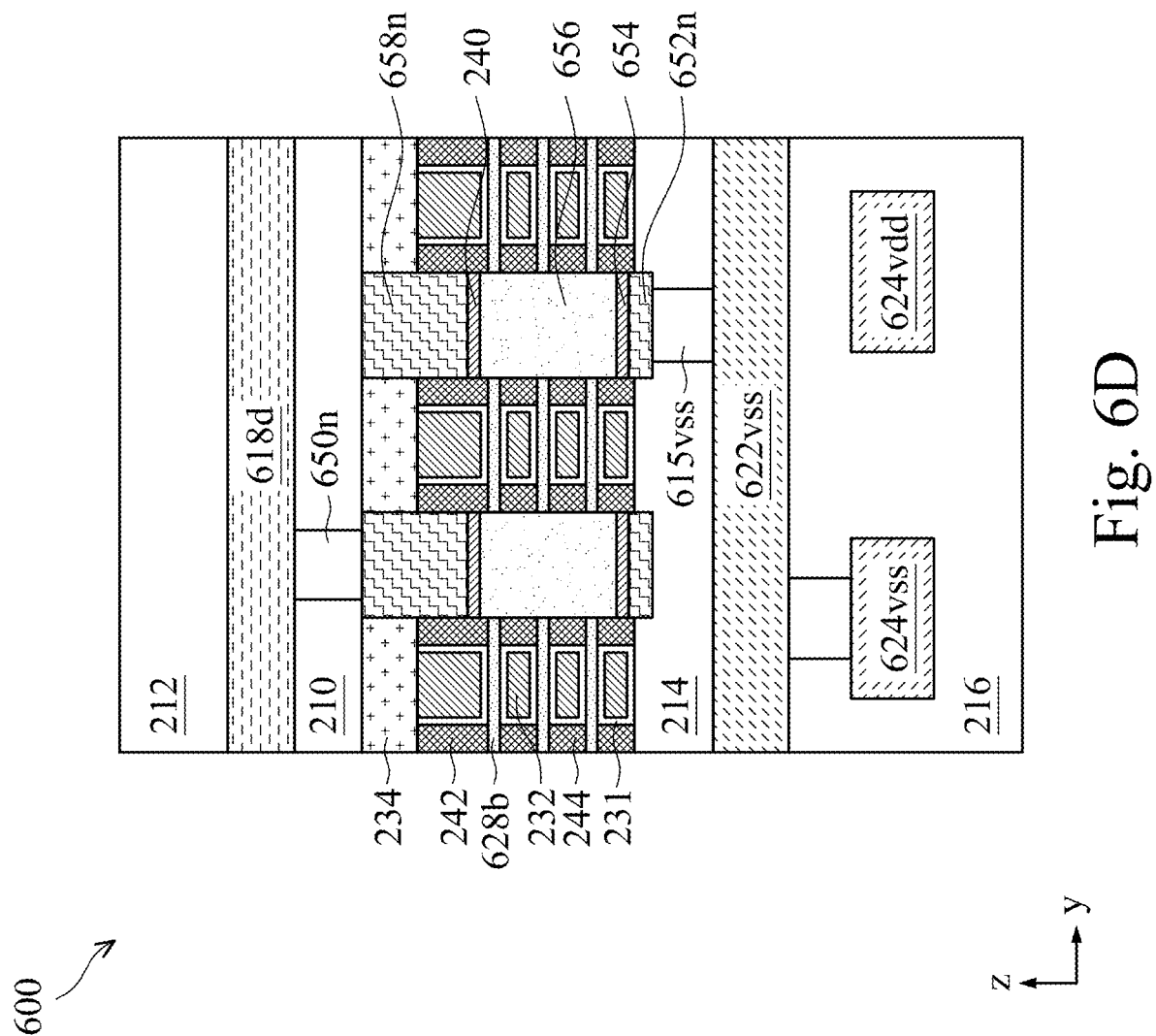

FIGS. 6A-6D are various views of a standard logic cell 600 according to embodiments of the present disclosure. FIG. 6A is a schematic front side routing layout of the standard logic cell 600 according to one embodiment of the present disclosure. FIG. 6B is a schematic back side routing layout of the standard logic cell 600. FIG. 6C is a schematic sectional view of the standard logic cell 600 along the 6C-6C line in FIG. 6A. FIG. 6D is a schematic sectional view of the standard logic cell 600 along the 6D-6D line in FIG. 6A. The standard logic cell 600 may be used in an IC chip having embedded memory cells, such as the bit cell 102 described above. The standard logic cell 600 may be any suitable logic cells, such as inverter (INV), AND, OR, NAND, NOR, Flip-Flop, SCAN, a random combination thereof, or a specific functional circuit.

In some embodiments, the standard logic cell 600 may be fabricated on the same substrate with the bit cells 102 described above. Thus, one or more layers, such as the STI layer 206, the ILD layer 208, the ILD layer 210, the front side IMD layer 212, the back side dielectric layer 214, and the back side IMD layer 216, may be fabricated during the same processes in the standard logic cell 600 and the bit cells 102.

The standard logic cell 600 may be formed on and in a semiconductor substrate. Dotted lines 602 indicates a cell boundary of the standard logic cell 600. Transistors of the standard logic cell 600 are formed over a p-well 626P and a n-well 626N. Fin structures 628a, 628b are formed along a first direction, such as the y-direction. Gate structures 630a, 630b, 630c are formed along a second direction, such as the x-direction over the fin structures 628a, 628b. Each of the fin structures 628a, 628b includes two or more nanosheet semiconductor channels 628. FIGS. 6A and 6B schematically illustrates positions of the fin structures 628a, 628b prior to formation of source/drain features. During fabrication, portions of the fin structures 628a, 628b not covered by the gate structures 630a, 630b, 630c are etched back, and epitaxial source/drain features 656, shown in FIG. 6D, are then formed on both sides of the gate structures 630a, 630b, 630c to form the transistors. As shown in FIG. 6C, the fin structure 628a may have a width w5 along the x-direction, and the fin structure 628b may have a width w6 along the x-direction.

One or more p-type transistors are formed along the fin structure 628a over the n-well 626N. One or more N-type transistors are formed along the fin structure 628b over the p-well 626P. The transistors are formed on a semiconductor substrate during FEOL processes and embedded in the STI layer 206 and the ILD layer 208. Front side source/drain contact features 658p, 658n are formed over one or more of the epitaxial source/drain features 656 in MEOL processes and embedded in then ILD layer 210. In some embodiments, the front side source/drain contact features 658p, 658n may be used to connect the corresponding source/drain features 656 to signal lines. Back side source/drain contact features 652p, 652n are formed under one or more of the epitaxial source/drain features 656, during back side process. In some embodiments, a silicide layer 654 may be formed between the back side source/drain contact features 652p, 652n and the epitaxial source/drain features 656. In some embodiments, the back side source/drain contact features 652p, 652n may be used to connect the corresponding source/drain features 656 to a power source.

As shown in FIG. 6A, conductive routing lines 618 are formed in the first conductive layer 218 formed in the front side IMD layer 212. In some embodiments, the conductive routing lines 618 are substantially parallel to each other and may be arranged along the y-direction. Alternatively, the conductive routing lines 618 may be arranged along the x-direction. In some embodiments, the conductive routing lines 618 are signal lines configured to provide signal communication to the transistors.

In the embodiment shown in FIG. 6A, the conductive routing lines 618 include conductive routing lines 618a 618b, 618c, 618d, 618e. The conductive routing lines 618a, 618c, 618e are used to provide signal communication to the gate structures 630c, 630b, 630a respectively. Gate contact features 646a, 646b are formed through the ILD layer 210. The conductive routing lines 618e and 618c are connected to the gate structures 630a, 630b by the gate contact features 646a, 646b respectively.

The conductive routing line 618b is used to provide signal communication with the source/drain features 656 along the fin structure 628a and the conductive routing line 618d is used to provide signal communication with the source/drain features 656 along the fin structure 628b. Conductive vias 650p, 650n are formed through the ILD layer 210. The conductive routing lines 618b and 618d are connected to the front side source/drain contact features 658p, 658n by the conductive vias 650p, 650n respectively.

In FIGS. 6A-6D, two back side conductor layers 622, 624 are embedded in the back side IMD layer 216 to provide power supply to the transistors in the standard logic cell 600. Less or more embedded conductor layers may be included in the back side IMD layer 216 according to circuit design.

FIG. 6B schematically illustrates the layout of back side power rail. The first back conductive layer 622 includes a conductive routing line 622vss configured to connect to the low-voltage source VSS and a conductive routing line 622vdd configured to connect to the high-voltage source VDD. In some embodiments, the conductive routing lines 622vss, 622vdd may be formed along the y-direction or a direction parallel to the fin structures 628a, 628b. Alternatively, the conductive routing lines 622vss, 622vdd may be formed along the x-direction or a direction perpendicular to the fin structures 628a, 628b. Conductive vias 615vss, 615vdd are formed through the back side dielectric layer 214. The conductive routing lines 622vss and 622vdd are connected to the back side source/drain contact features 652n, 652p by the conductive vias 615vss, 615vdd respectively.

The second back conductive layer 624 includes a conductive routing line 624vss configured to connect to the low-voltage source VSS and a conductive routing line 624vdd configured to connect to the high-voltage source VDD. In some embodiments, the conductive routing lines 624vss, 624vdd may be formed along the x-direction or a direction perpendicular to the conductive routing lines 622vss, 622vdd. Conductive vias 623vss, 623vdd are formed through the back side IMD layer 216. The conductive routing lines 624vss and 624vdd are connected to the conductive routing lines 622vss, 622vdd by the conductive vias 623vss, 623vdd respectively.

Figure 7:
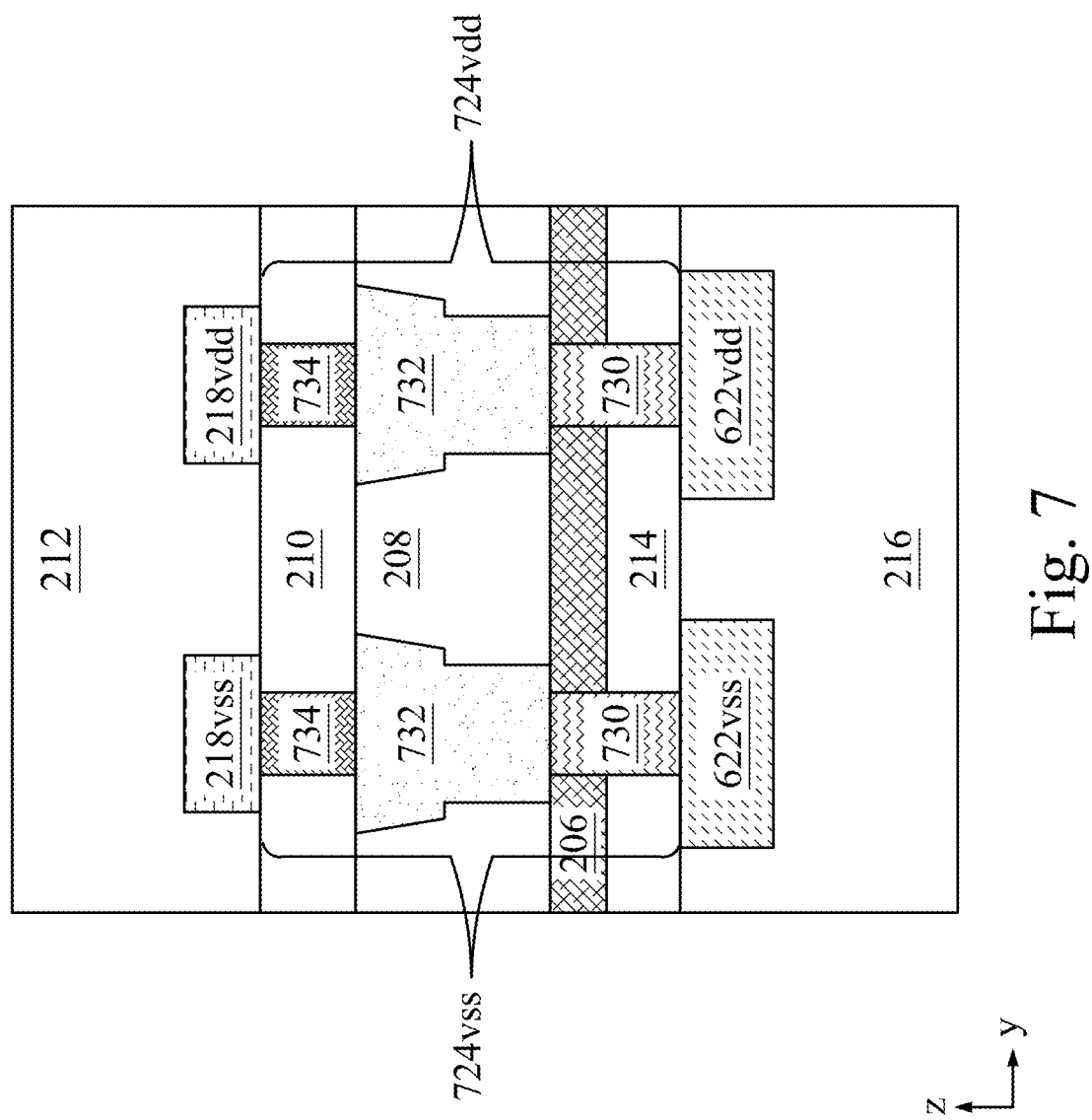
FIG. 7 schematically illustrates power conductor tap structures according to some embodiments of the present disclosure.

In some embodiments, the integrated circuit 10 of the present disclosure further includes one or more power conductor tap structures for connecting power routing lines in the front side IMD layer 212 and power routing lines in the back side IMD layer 216. FIG. 7 schematically illustrates power conductor tap structures 724vss and 724vdd according to some embodiments of the present disclosure. The power conductor tap structures 724vss and 724vdd may be positioned in suitable place in the integrated circuit 10, for example, adjacent the standard logic cells 600 or adjacent the memory circuit 400.

The power conductor tap structures 724vss and 724vdd may include one or more conductive components formed through the back side dielectric layer 214, the STI layer 205, the ILD layer 208, and the ILD layer 210. The power conductor tap structure 724vss may be positioned to connect the front side conductive line 218vss to the back side conductive line 622vss. The power conductor tap structure 724vdd may be positioned to connect the front side conductive line 218vdd to the back side conductive line 622vdd.

In some embodiments, the power conductor tap structure 724vss, 724vdd includes a conductive tap via 730 extending from the back side conductive layer 622, wherein the conductive line 622vss or 622vdd is formed, through the back side dielectric layer 214 and the STI layer 206. The conductive tap via 730 is connected to a transistor layer conductor 732 formed through the ILD layer 208. The transistor layer conductor 732 is connected to a conductive via 734 is formed through the ILD layer 210. The conductive via 734 is connected to the front side conductive lines 218vss or 218vdd.

Figure 8:
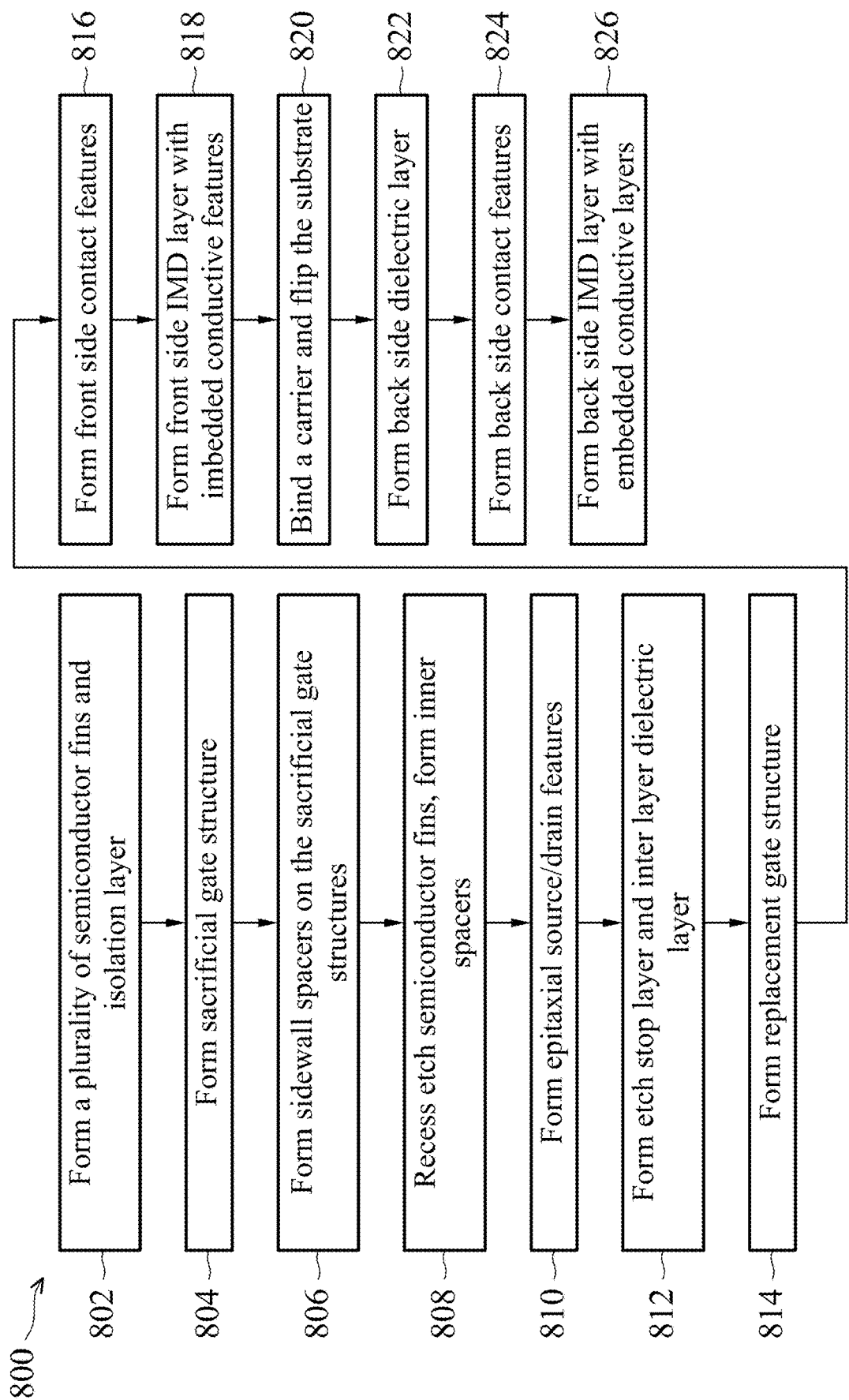
FIG. 8 is a flow chart of a method for fabricating the integrated circuit 10 according to embodiments of the present disclosure.

FIG. 8 is a flow chart of a method 800 for fabricating the integrated circuit 10 according to embodiments of the present disclosure. FIGS. 9A-9B, 10A-10B, 11A-11B, 12A-12B, 13A-13C, 14A-14C, and 15A-15C schematically illustrate various stages of manufacturing the integrated circuit 10 according to the method 800. As discussed above, the integrated circuit 10 includes logic circuits and embedded memory cells. Only a portion of the integrated circuit 10 corresponding to a bit cell 102 is shown in FIGS. 9A-9B, 10A-10B, 11A-11B, 12A-12B, 13A-13C, 14A-14C, and 15A-15C, as an example. Other portions of the integrated circuit 10 are manufactured during the same process operations with suitable designs. Additional operations can be provided before, during, and after operations/processes in the method 800, and some of the operations described below can be replaced or eliminated, for additional embodiments of the method. The order of the operations/processes may be interchangeable.

The method 800 begins at operation 802 where a plurality of fin structures 228a, 228b, 228c, 228d are formed over a substrate 200 as shown in FIGS. 9A and 9B. The substrate 200 may include a single crystalline semiconductor material such as, but not limited to Si, Ge, SiGe, GaAs, InSb, GaP, GaSb, InAIAs, InGaAs, GaSbP, GaAsSb, and InP. The substrate 200 may include various doping configurations depending on circuit design. For example, different doping profiles, e.g., n-wells, p-wells, may be formed in the substrate 200 in regions designed for different device types, such as n-type field effect transistors (NFET), and p-type field effect transistors (PFET). In some embodiments, the substrate 200 may be a silicon-on-insulator (SOI) substrate including an insulator structure (not shown) for enhancement.

The substrate 200 has a front surface 200f and a back surface 200b. A semiconductor stack may be deposited on the front surface 200f of the substrate 200. The semiconductor stack includes alternating semiconductor layers made of different materials to facilitate formation of nanosheet channels in a multi-gate device, such as nanosheet channel FETs. In some embodiments, the semiconductor stack includes first semiconductor layers 202 interposed by second semiconductor layers 228. The first semiconductor layers 202 and second semiconductor layers 228 have different oxidation rates and/or etch selectivity.

In later fabrication stages, portions of the second semiconductor layers 228 form nanosheet channels in a multi-gate device. Three first semiconductor layers 202 and three second semiconductor layers 228 are alternately arranged as illustrated in FIGS. 9A-9B as an example. More or less semiconductor layers 202, 228 may be included in the semiconductor stack depending on the desired number of channels in the semiconductor device to be formed. In some embodiments, the number of semiconductor layers 228 is between 2 to 6.

The semiconductor layers 202, 228 may be formed by a molecular beam epitaxy (MBE) process, a metalorganic chemical vapor deposition (MOCVD) process, and/or other suitable epitaxial growth processes. In some embodiments, the semiconductor layers 228 include the same material as the substrate 200. In some embodiments, the semiconductor layers 202, 228 include different materials than the substrate 200. In some embodiments, the semiconductor layers 202 and 228 are made of materials having different lattice constants. In some embodiments, the first semiconductor layers 202 include an epitaxially grown silicon germanium (SiGe) layer and the second semiconductor layers 228 include an epitaxially grown silicon (Si) layer. Alternatively, in some embodiments, either of the semiconductor layers 202 and 228 may include other materials such as Ge, a compound semiconductor such as SiC, GeAs, GaP, InP, InAs, and/or InSb, an alloy semiconductor such as SiGe, GaAsP, AlInAs, AlGaAs, InGaAs, GaInP, and/or GaInAsP, or combinations thereof.

In some embodiments, each second semiconductor layer 228 has a thickness in a range between about 4 nm and about 8 nm. In some embodiments, the second semiconductor layers 228 in the semiconductor stack are uniform in thickness. The first semiconductor layers 202 in channel regions may eventually be removed and serve to define a vertical distance between adjacent channel regions for a subsequently formed multi-gate device. In some embodiments, the thickness of the first semiconductor layer 202 is equal to or greater than the thickness of the second semiconductor layer 228. In some embodiments, each semiconductor layer 202 has a thickness in a range between about 6 nm and about 15 nm.

The fin structures 228a, 228b, 228c, 228d may be formed by patterning a hard mask (not shown) formed on the semiconductor stack and one or more etching processes. In FIG. 9A, the fin structures 228a, 228b, 228c, 228d are formed along the y direction. A width the fin structures 228a, 228b, 228c, 228d along the x direction is in a range between about 4 nm and about 70 nm.

The STI layer 206 is formed in the trenches between the fin structures 228a, 228b, 228c, 228d, as shown in FIG. 9A. The STI layer 206 is formed over the substrate 200 to cover the well portion the fin structures 228a, 228b, 228c, 228d. The STI layer 206 may be formed by a high density plasma chemical vapor deposition (HDP-CVD), a flowable CVD (FCVD), or other suitable deposition process. In some embodiments, the STI layer 206 may include silicon oxide, silicon nitride, silicon oxynitride, fluorine-doped silicate glass (FSG), a low-k dielectric, combinations thereof. In some embodiments, the STI layer 206 is formed to cover the fin structures 228a, 228b, 228c, 228d by a suitable deposition process, such as atomic layer deposition (ALD), and then recess etched using a suitable anisotropic etching process to expose the active portions of the fin structures 228a, 228b, 228c, 228d.

In operation 804, sacrificial gate structures 230 including a sacrificial gate dielectric layer 270 and sacrificial gate electrode layer 272 are formed over the fin structures 228a, 228b, 228c, 228d as shown in FIGS. 10A and 10B. The sacrificial gate electrode layer 272 may include silicon such as polycrystalline silicon or amorphous silicon. The sacrificial gate electrode layer 272 may be deposited using CVD, including LPCVD and PECVD, PVD, ALD, or other suitable process, and then etched back. In some embodiment, the gate structure 230 may have a gate length L1 along the y-direction in a range between 6 nm and 20 nm.

In operation 806, the sidewall spacers 242 are formed on sidewalls of each sacrificial gate structure as shown in FIGS. 10A and 10B. The sidewall spacers 242 may be formed by a blanket deposition of an insulating material followed by anisotropic etch to remove insulating material from horizontal surfaces. The sidewall spacers 242 may have a thickness in a range between about 4 nm and about 12 nm. In some embodiments, the insulating material of the sidewall spacers 242 may include materials selected from a group consist of SiO2, Si3N4, carbon doped oxide, nitrogen doped oxide, porous oxide, air gap, or combination In operation 808, the fin structures 228a, 228b, 228c, 228d on opposite sides of the sacrificial gate structure 230 are recess etched to form source/drain spaces and the inner spacers 244 are formed as shown in FIGS. 10A-10B. The first semiconductor layers 202 and the second semiconductor layers 228 in the fin structures 228a, 228b, 228c, 228d are etched down on both sides of the sacrificial gate structure 230 using etching operations. In some embodiments, all layers in the semiconductor stack of the fin structures 228a, 228b, 228c, 228d are etched to expose the well portion of the fin structure 228a, 228b, 228c, 228d. The inner spacers 244 are formed on exposed ends of the first semiconductor layers 202 under the sacrificial gate structure 230. The first semiconductor layers 202 exposed to the source/drain spaces are first etched horizontally along the y-direction to form cavities. In some embodiments, the first semiconductor layers 202 can be selectively etched by using a wet etchant such as, but not limited to, ammonium hydroxide (NH$_4$OH), tetramethylammonium hydroxide (TMAH), ethylenediamine pyrocatechol (EDP), or potassium hydroxide (KOH) solutions. In some embodiments, the amount of etching of the first semiconductor layer 202 is in a range between about 4 nm and about 12 nm along the y direction. After forming cavities in the first semiconductor layers 202, the inner spacers 244 can be formed in the cavities by conformally deposit and then partially remove an insulating layer. The insulating layer can be formed by ALD or any other suitable method. The subsequent etch process removes most of the insulating layer except inside the cavities, resulting in the inner spacers 244.

The inner spacers 244 may include a single layer or multiple layers. In some embodiments, the inner spacers 244 may include SiO2, Si3N4, SiON, SiOC, SiOCN base dielectric material, air gap, or combination. In some embodiments, the effective dielectric constant K of the inner spacer 244 is higher than the dielectric constant K of the sidewall spacers 242. The inner spacers 244 have a thickness along the y direction. In some embodiments, the thickness of the inner spacers 244 in a range from about 4 nm to about 12 nm.

In operation 810, epitaxial source/drain features 274 (corresponding to the epitaxial source/drain features 656 in the standard logic cell 600 or the epitaxial source/drain features 114ep, 118ep, 122ep, 124ep, 126ep, 128ep in the bit cell 102) are formed in the source/drain spaces, as shown in FIGS. 10A-10B. The epitaxial source/drain features 274 may be formed by an epitaxial growth method using CVD, ALD or molecular beam epitaxy (MBE). The epitaxial source/drain features 274 may include one or more layers of Si, SiP, SiC and SiCP for n-type FET or Si, SiGe, Ge for a PFET. For the p-type FET, p-type dopants, such as boron (B), may also be included in the epitaxial source/drain features 274.

In operation 812, a contact etch stop layer (CESL) layer, not shown is formed over the epitaxial source/drain features 274, and the interlayer dielectric (ILD) layer 208 is formed over the CESL layer. The materials for the ILD layer 208 include compounds comprising Si, O, C, and/or H, such as silicon oxide, SiCOH and SiOC. Organic materials, such as polymers, may be used for the ILD layer 208. After the ILD layer 208 is formed, a planarization operation, such as CMP, is performed to expose the sacrificial gate electrode layer 272 for subsequent removal.

In operation 814, replacement gate process sequence is performed to form the gate dielectric layer 231 and the gate electrode layer 232, as shown in FIGS. 11A-11B. The sacrificial gate electrode 272 is first removed using plasma dry etching and/or wet etching to expose the fin stack within the gate region. The first semiconductor layers 202 are removed leaving the second semiconductor layers 228 as nano-sheet channels connecting the epitaxial source/drain features 274. The first semiconductor layers 202 can be removed using an etchant that can selectively etch the first semiconductor layers 202 against the second semiconductor layers 228. When the first semiconductor layers 202 are Ge or SiGe and the second semiconductor layers 228 are Si, the first semiconductor layers 202 can be selectively removed using a wet etchant such as, but not limited to, ammonium hydroxide ($NH_4OH$), tetramethylammonium hydroxide (TMAH), ethylenediamine pyrocatechol (EDP), or potassium hydroxide (KOH) solution.

The gate dielectric layer 231 is formed around each nanosheet of the second semiconductor layers 228, and a gate electrode layer 232 is formed on the gate dielectric layer 231. The gate dielectric layer 231 and the gate electrode layer 232 may be referred to as a replacement gate structure. The gate dielectric layer 231 may be formed by CVD, ALD or any suitable method. In one embodiment, the gate dielectric layer 231 is formed using a highly conformal deposition process such as ALD in order to ensure the formation of a gate dielectric layer 231 having a uniform thickness around each of the second semiconductor layers 228. In some embodiments, the thickness of the gate dielectric layer 231 is in a range between about 1 nm and about 6 nm.

The gate dielectric layer 231 includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof.

In some embodiments, an interfacial layer (not shown) is formed between the second semiconductor layer 228 and the gate dielectric layer 231. In some embodiments, one or more work function adjustment layers (not shown) are interposed between the gate dielectric layer 231 and the gate electrode layer 232.

The gate electrode layer 232 is formed on the gate dielectric layer 231 to surround each of the second semiconductor layer 228 (i.e., each channel) and the gate dielectric layer 231. The gate electrode layer 232 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. In some embodiments, the gate electrode layer 232 is formed by work-function metal selected from a group consisting of TiN, TaN, TiAl, TiAlN, TaAl, TaAlN, TaAlC, TaCN, WNC, Co, Ni, Pt, W, or combination. The work-function metal in n-type MOSFET and p-type MOSFET can be formed by same, or different material.

The gate electrode layer 232 may be formed by CVD, ALD, electro-plating, or other suitable method. After the formation of the gate electrode layer 232, a planarization process, such as a CMP process, is performed to remove excess deposition of the gate electrode material and expose the top surface of the ILD layer 208.

In some embodiments, a cut gate process is performed to remove a portion of the gate electrode layer 232 and fill in a dielectric material to form the gate isolator 236. The gate isolator 236 electrically isolates the gates of the transistors on the opposite sides of the gate isolator 236. The gate isolator 236 may be include materials selected from a group consisting of oxide, Si3N4, nitride-base dielectric, Carbon-base dielectric, high K material (K>=9), or combination.

In some embodiments, the sidewall spacers 242, the gate electrode 232, and the gate dielectric layer 231 are etched back to form a trench over the gate top. A dielectric material is filled in the trench to form the self-aligned contact (SAC) layer 234. The SAC layer 234 may include multiple dielectric material and selected from a group consisting of oxide, SiOC, SiON, SiOCN, nitride base dielectric, metal oxide dielectric, Hf oxide (HfO2), Ta oxide (Ta2O5), Ti oxide (TiO2), Zr oxide (ZrO2), Al oxide (Al2O3), Y oxide ($Y_2O_3$, or combination. In some embodiments, the SAC layer 234 may have a thickness in the z-direction in a range of 2 nm to 60 nm.

Figures 12A, 12B:
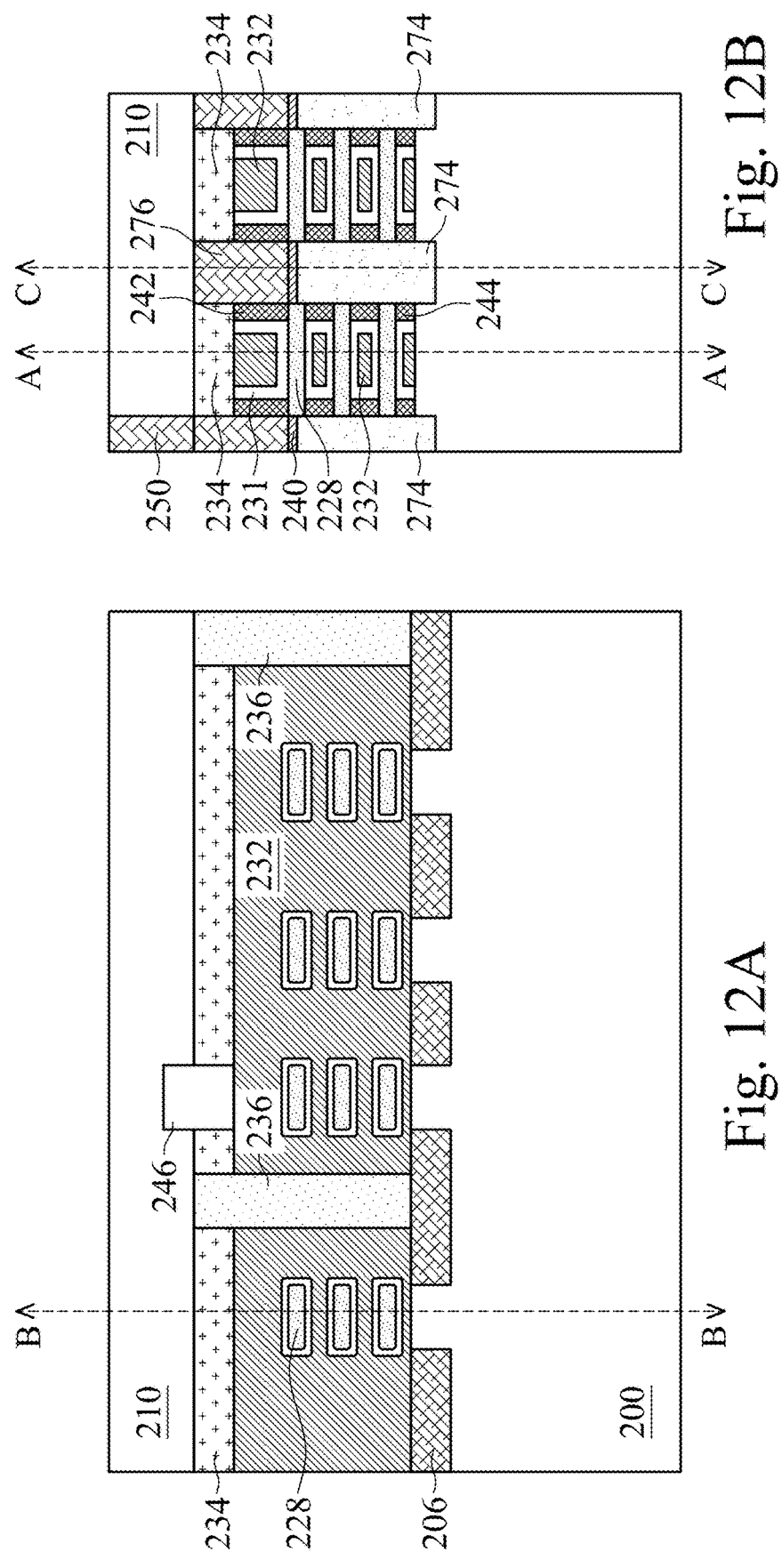
Figure 12C:
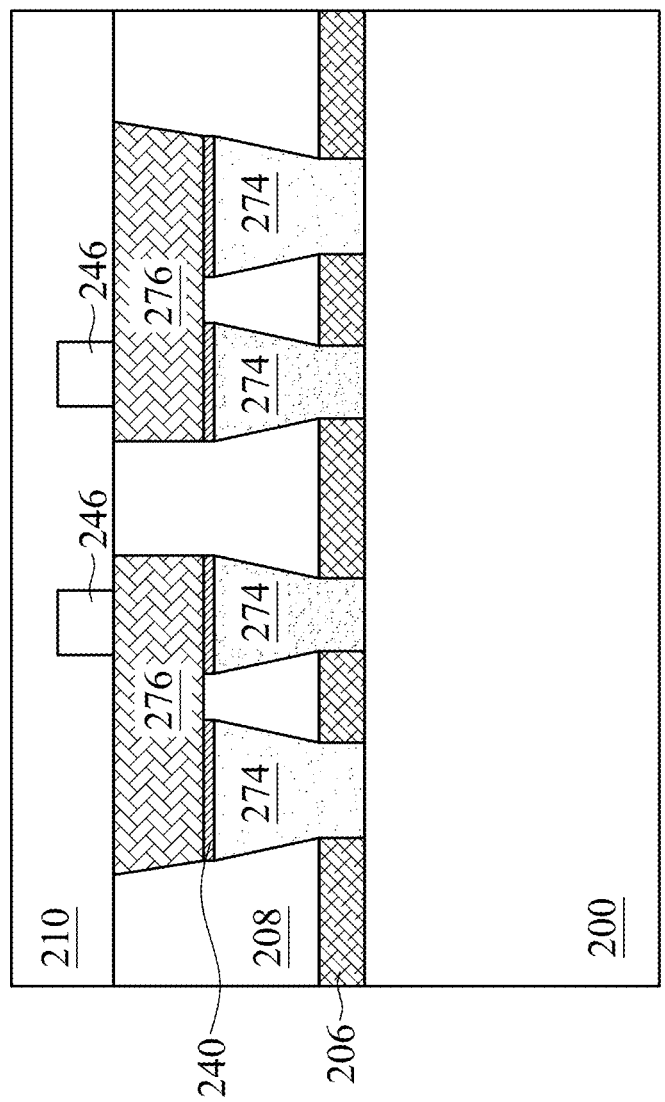

In operation 816, front side contacts, such as front side gate contact features 246, and front side source/drain contact features 276 are formed, as shown in FIGS. 12A-12C. The front side source/drain contact features 276 (corresponding to the source/drain contact features 114s, 114d, 118s, 118d, 122s, 122d, 124s, 124d, 126s, 126d, 128s, 128d in the bit cell 102 and the front side source/drain contact features 658n, 658p in the standard logic cell 600) are through the ILD layer 208 as shown in FIGS. 12A-12C. Prior to forming the front side source/drain contact features 276, contact holes are formed in the ILD layer 208. Suitable photolithographic and etching techniques are used to form the contact holes through various layers, including the ILD layer 208 and the CESL to expose the epitaxial source/drain features 274. After the formation of the contact holes, the silicide layer 240 is selectively formed over an exposed top surface of the epitaxial source/drain features 274. The silicide layer 240 conductively couples the epitaxial source/drain features 274 to the subsequently formed front side source/drain contact features 276. The silicide layer 240 may be formed by depositing a metal source layer over the substrate 200 to cover the epitaxial source/drain features 274 and performing a rapid thermal annealing process. In some embodiments, the metal source layer includes a metal layer selected from W, Co, Ni, Ti, Mo, and Ta, or a metal nitride layer selected from tungsten nitride, cobalt nitride, nickel nitride, titanium nitride, molybdenum nitride, and tantalum nitride. After the formation of the metal source layer, a rapid thermal anneal process is performed, for example, a rapid anneal at a temperature between about 700° C. and about 900° C.

During the rapid anneal process, the portion of the metal source layer over the epitaxial source/drain features 274 reacts with silicon in the epitaxial source/drain features 274 to form the silicide layer 240. Unreacted portion of the metal source layer is then removed. In some embodiments, the silicide layer 240 includes one or more of WSi, CoSi, NiSi, TiSi, MoSi, and TaSi. In some embodiments, the silicide layer 240 has a thickness in a range between about 4 nm and 10 nm.

After the silicide layer 240 is formed, the front side source/drain contact features 276 are formed in the contact holes by CVD, ALD, electro-plating, or other suitable method. The front side source/drain contact features 276 may be in contact with the silicide layer 240. The front side source/drain contact features 276 may include one or more of Co, Ni, W, Ti, Ta, Cu, Al, TIN and TaN. In some embodiments, a barrier layer, not shown, may be formed on sidewalls of the contact holes prior to forming the front side source/drain contact features 276.

The front side source/drain contact features 276 are selectively formed over some of the epitaxial source/drain features 274 according to circuit design. The front side source/drain contact features 276 may be connected to signal lines in the subsequent formed front side interconnect structure, such as in the standard logic cell 600. In some embodiments, the front side source/drain contact features 276 are formed over the epitaxial source/drain features 274 to a power rail, such as VDD or VSS, such as in the bit cell 102. In other embodiments, the front side source/drain contact features 276 are formed over the epitaxial source/drain features 274, but without any further connection, for structural balance in the device.

After formation of the front side source/drain contact features 276, the ILD layer 210 is deposited over the substrate. The gate contact features 246 are then formed by forming openings in the ILD layer 210 and in the SAC layer 234, and filling a conductive material in the opening. In some embodiments, the gate contact features 246 are further connected to signal lines in the front side IMD layer 212, such as in the standard logic cell 600. In other embodiments, the gate contact features 246 may be connect to one of the source/drain contact features 276 to form a butt contact, as in the bit cell 102. The conductive vias 250 may also be formed through the ILD layer 210 to connect with the front side source/drain contact features 276.

Figure 13C:
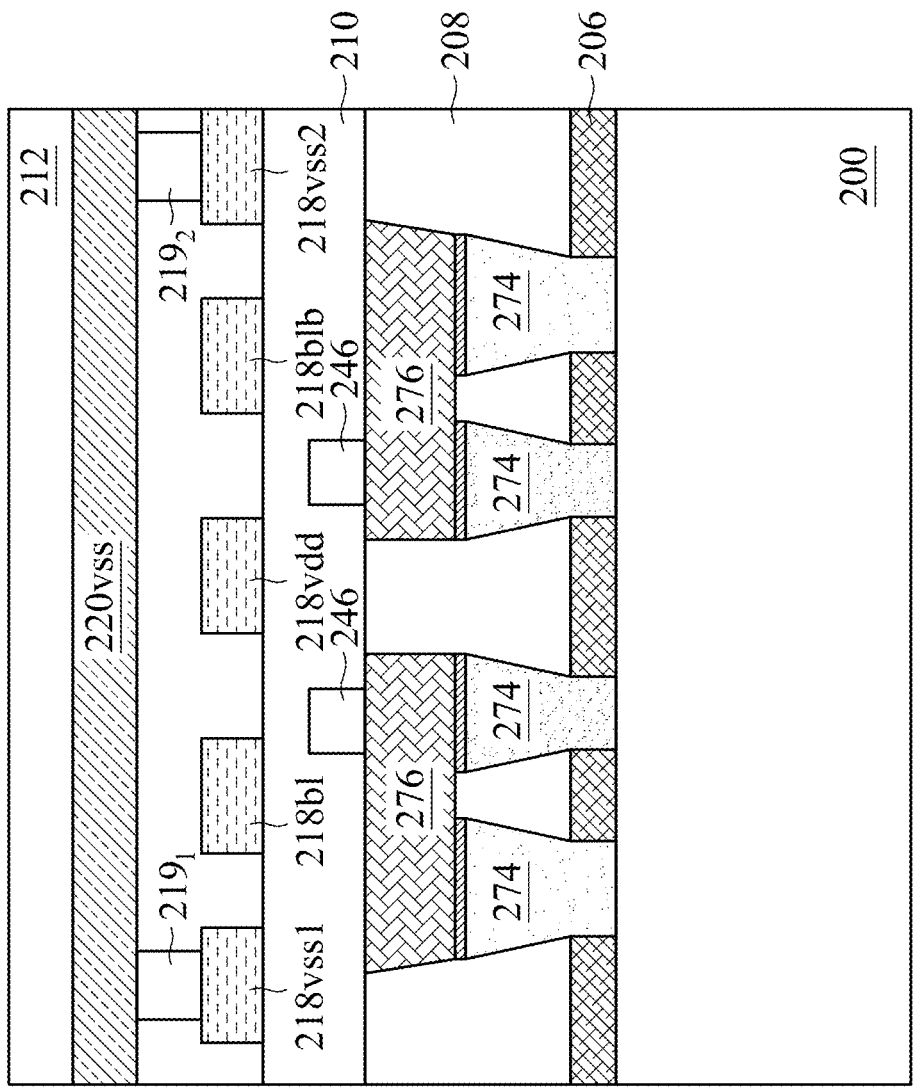

In operation 818, a front side interconnect structure is formed over on the second ILD layer 210 and electrically connected to the active semiconductor devices on the substrate 200, as shown in FIGS. 13A-13C. The front side interconnect structure includes the front side IMD layer 212 having multiple layers of conductive lines and vias formed therein. The front side IMD layer 212 may include multiple sets of inter-layer dielectric (ILD) layers. In some embodiment, the front side interconnect structure may include bit lines and power mesh as in the bit cell 102. In other embodiments, the front side interconnect structure includes signal lines, as in the standard logic cell 600.

Figure 14B:
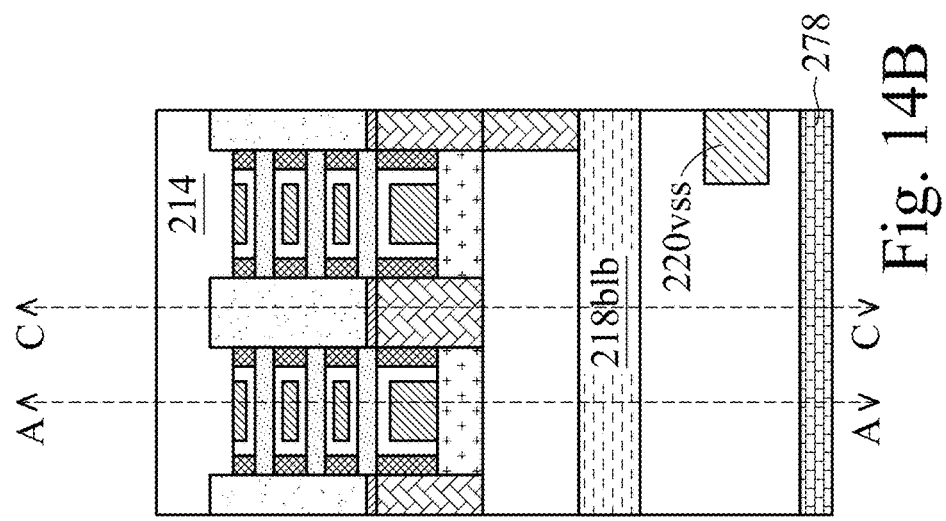
Figure 14A:
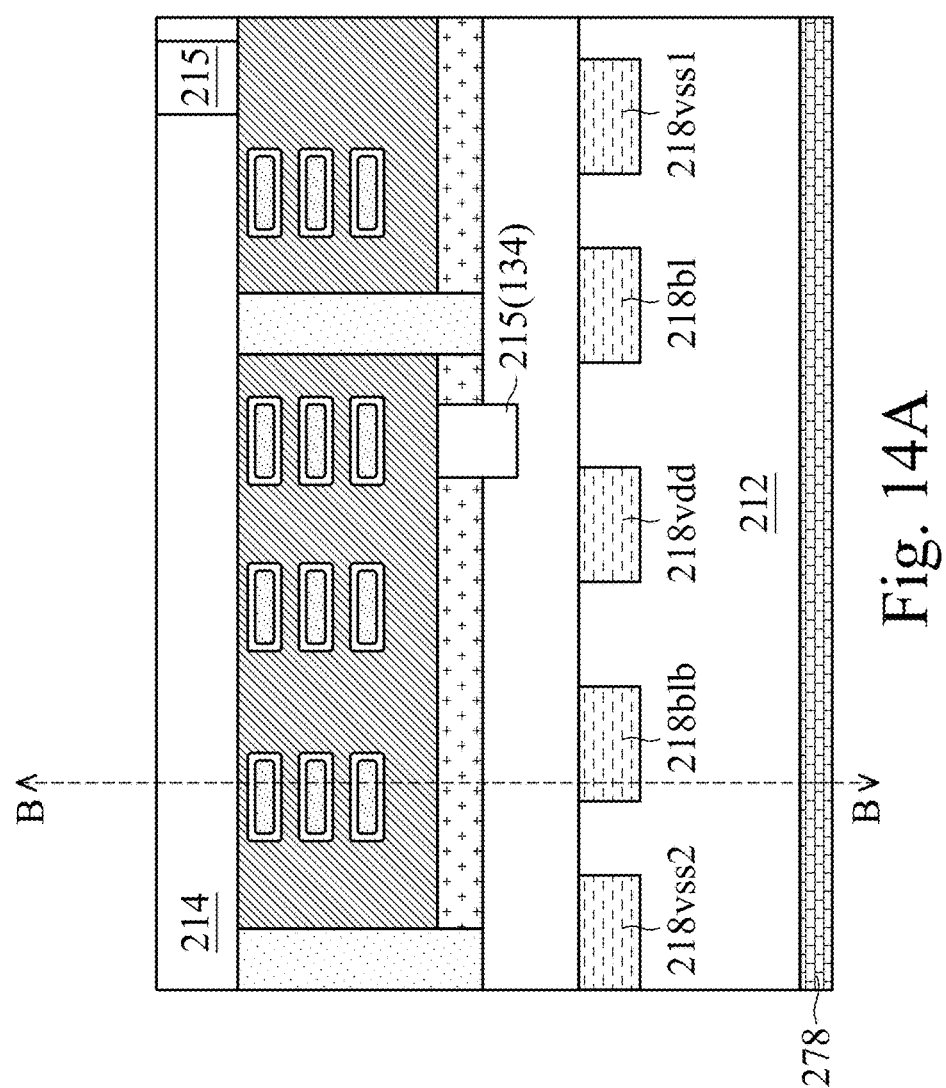
Figure 14C:
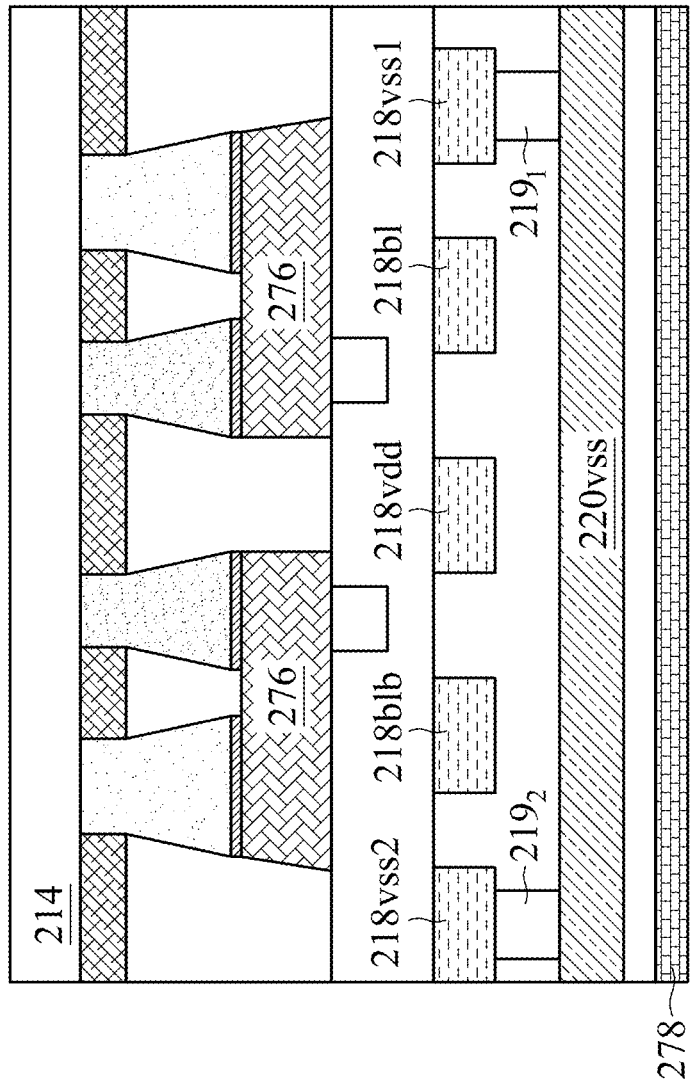

In operation 820, after the formation of the front side interconnect structure a carrier wafer 278 is temporarily bonded to a top side of the front side interconnect structure, as shown FIGS. 14A-C. The carrier wafer 278 serves to provide mechanical support for the front side interconnect structure and devices formed on the substrate 200. After the carrier wafer 278 is bond to the substrate 200, the carrier wafer 278 along with the substrate 200 is flipped over so that the backside of the substrate 200 (i.e., the back surface 10*b*) is facing up for backside processing.

In operation 822, grinding and etching process may be performed to remove semiconductor material from the backside, and then depositing a dielectric material to form the back side dielectric layer 214.

In operation 824, back side contact features, such as the back side gate conductive vias 215 in the bit cell 102 and the back side source/drain contact features 652 and conductive vias 615, are formed through the back side dielectric layer 214, as shown in FIGS. 14A-14C. The gate conductive vias 215 or the source/drain conductive vias 615 may include multiple metal material composition. The materials are selected from a group consisting of Ti, TIN, TaN, Co, Ru, Pt, W, Al, Cu, or combination.

Figure 15B:
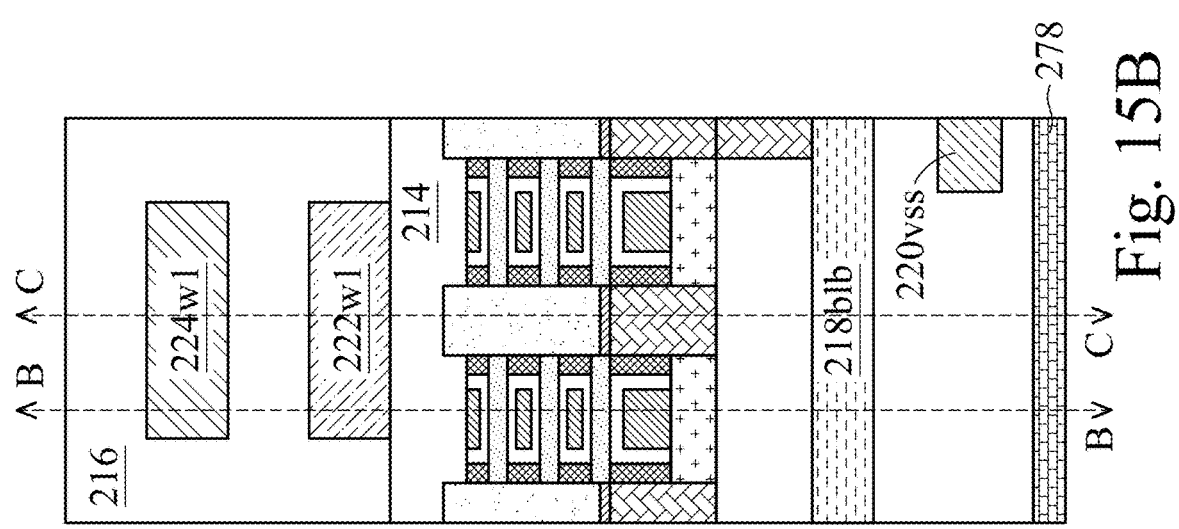
Figure 15A:
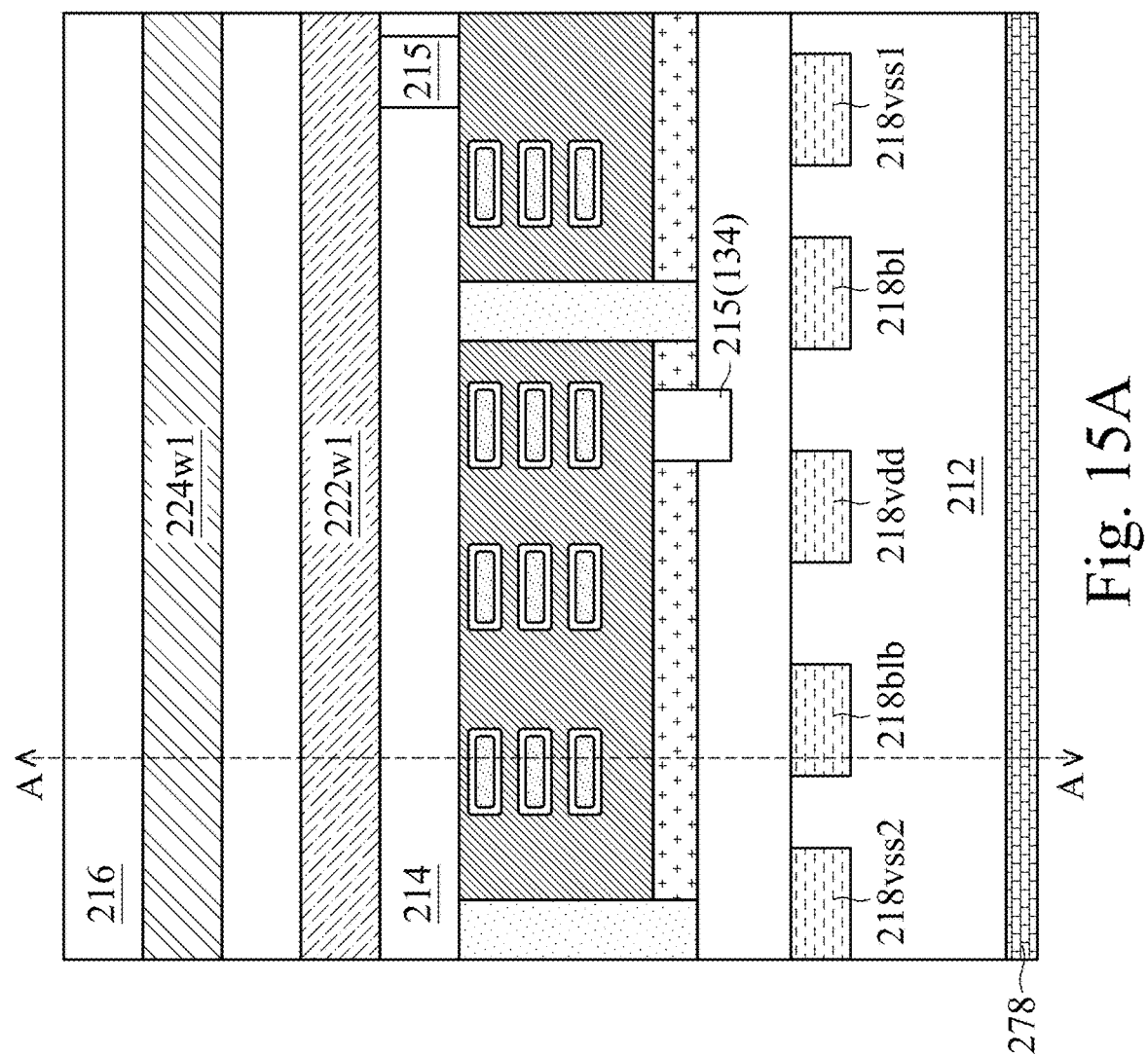
Figure 15C:
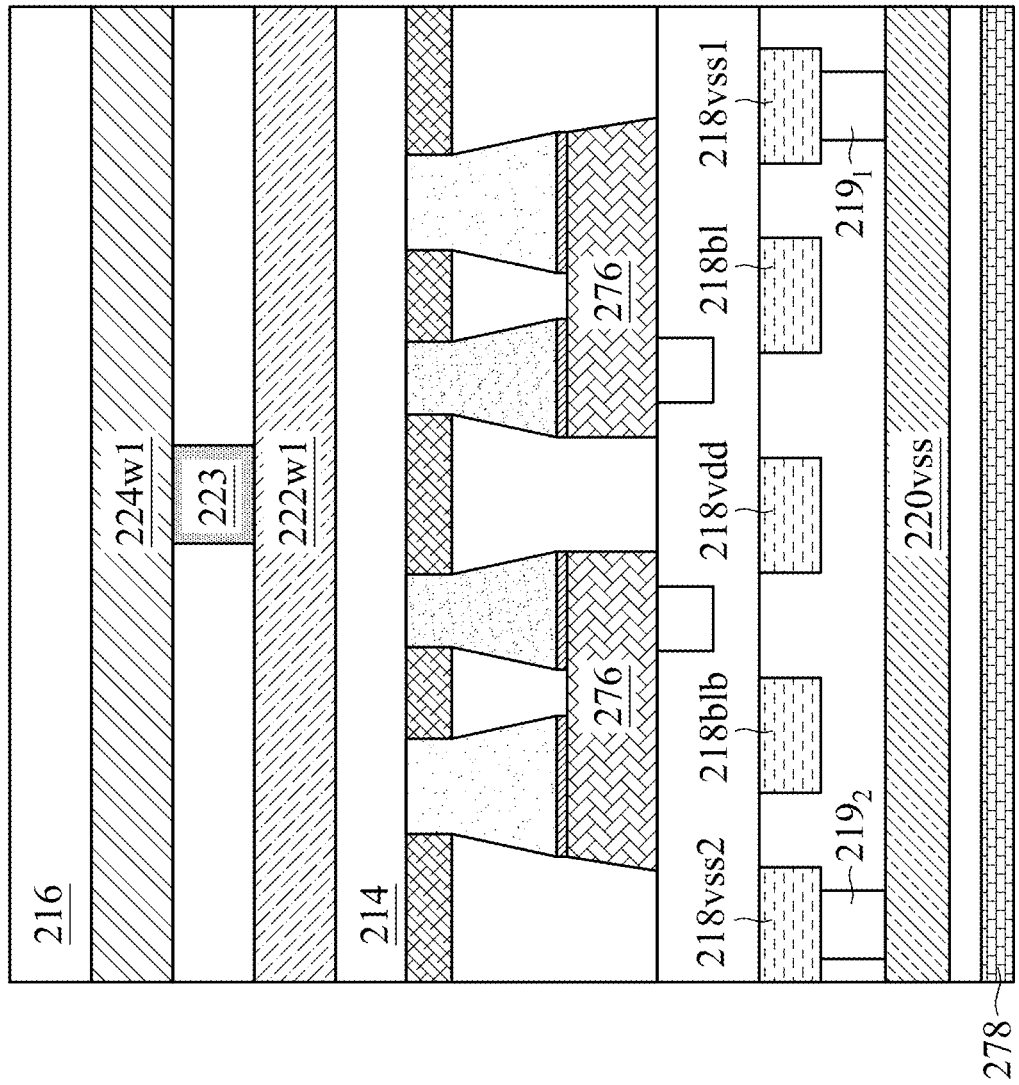

In operation 826, a backside interconnect structure is formed over the back side dielectric layer 214, as shown in FIGS. 15A-15C. The back side interconnect structure includes the back side IMD layer 216 having multiple layers of conductive lines and vias formed therein. The back side IMD layer 216 may include multiple sets of inter-layer dielectric (ILD) layers. In some embodiment, the back side interconnect structure may include one or more layers of word lines, as in the bit cell 102. In other embodiments, the back side interconnect structure includes a back side power rail, as in the standard logic cell 600.

Various embodiments or examples described herein offer multiple advantages over the state-of-art technology. By using GAA transistors in memory cells, ICs according to the present disclosure provide more channel width with least area than conventional planar transistor or FinFET transistor, and also allow channel length continues scaling. By positioning the word lines on the back side, the ICs according to the present disclosure also improve routing efficiency, thus, removing bottleneck of further scaling both SRAM cell. By using back side power rail in standard logic cells in ICs with embedded memory cells and standard logic STD cells, the ICs further scaling in the logic cells.

It will be understood that not all advantages have been necessarily discussed herein, no particular advantage is required for all embodiments or examples, and other embodiments or examples may offer different advantages.

Some embodiments of the present disclosure provide a memory cell comprising a device layer having transistors formed therein, a first front side conductive layer disposed above the device layer, wherein the first front side conductive layer includes, a bit line, a high-voltage line, and a low-voltage line, wherein the bit line, the high-voltage line, and the low-voltage line extend along a first direction, and a first back side conductive layer disposed below the device layer, wherein the first back side conductive layer includes a first word line extending along a second direction perpendicular to the first direction.

Some embodiments of the present disclosure provide an integrated circuit chip comprising a memory cell array including a plurality of SRAM (static random-access memory) cells arranges in columns and rows, a plurality of word line routing conductors extending along a first direction on a back side of the memory cell array, and a column of edge cells located at an edge of the memory cell array, wherein each edge cell includes a word line tap structure connected between the plurality of word line routing conductors on the back side and a plurality of word line signal lines located on a front side the memory cell array.

Some embodiments of the present disclosure an integrated circuit chip comprising a plurality of SRAM (static random-access memory) cells, wherein each SRAM cell comprises a word line located in a first back side conductive layer, and a front side voltage line located in a first front side conductive layer, and a plurality of standard logic cells, wherein each standard logic cell comprises a back side voltage line located in the first back side conductive layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. An integrated circuit chip, comprising:
   a memory cell array including a plurality of SRAM (static random-access memory) cells arranged in columns and rows, wherein each SRAM cell comprises: a gate electrode and a back side gate contact via in contact with the gate electrode;
   a plurality of word line routing conductors extending along a first direction on a back side of the memory cell array, wherein the back side gate contact via in each SRAM cell is in contact with one of the plurality of word line routing conductors; and
   a column of edge cells located at an edge of the memory cell array, wherein each edge cell includes a word line tap structure connected between the plurality of word line routing conductors on the back side and a plurality of word line signal lines located on a front side the memory cell array.

2. The integrated circuit chip of claim 1, further comprising a word line driver, and the word line signal lines are connected between the edge cell and the word line driver.

3. The integrated circuit chip of claim 1, further comprising a plurality of bit line routing conductors extending along a second direction on the front side of the memory cell array.

4. The integrated circuit chip of claim 3, wherein the plurality of bit line routing conductors are located in a first front side conductive layer, and the word line signal lines are located in a second front side conductive layer.

5. The integrated circuit chip of claim 1, wherein the word line tap structure includes a tap via extending from a back side dielectric layer, through a STI layer, into a portion of a front side ILD layer.

6. The integrated circuit chip of claim 1, wherein the word line tap structure includes a tap via extending from a back side dielectric layer, through a STI layer, and a front side conductive layer.

7. The integrated circuit chip of claim 1, further comprising a plurality of second word line conductors located below the plurality of word line conductors.

8. The integrated circuit chip of claim 7, further comprising a plurality of contact vias connected between the plurality of second word line conductors and the plurality of word line conductors.

9. An integrated circuit chip, comprising:
   a plurality of a plurality of SRAM (static random-access memory) cells, wherein each SRAM cell comprises:
   six transistors formed in a device layer on a substrate;
   a back side gate contact via formed on a back side of the device layer, wherein the back side gate contact via is in contact with a gate electrode of one of the six transistors;
   a word line located in a first back side conductive layer and in contact with the back side contact vias; and
   a front side voltage line located in a first front side conductive layer and connected to the transistors from a front side of the device layer; and
   a plurality of standard logic cells formed on the substrate, wherein each standard logic cell comprises:
   a back side voltage line located in the first back side conductive layer.

10. The integrated circuit chip of claim 9, further comprising a plurality of edge cells, wherein each edge cell includes a word line tap structure having a first end connected to the word line and a second end connected to a signal line located in a second front side conductive layer.

11. The integrated circuit chip of claim 9, further comprising a power conductor tap structure having a first end connected to the back side voltage line in the first back side conductive layer and a second end connected to a voltage line located in the first front side conductive layer.

12. The integrated circuit chip of claim 9, wherein each SRAM cell further comprises:
    a second word line located in a second back side conductive layer.

13. The integrated circuit chip of claim 12, wherein each standard logic cell comprises:
    a second back side voltage line located in the second back side conductive layer.

14. An integrated circuit chip, comprising:
    an array of SRAM (static random-access memory) cells, wherein each of the plurality of SARM cells comprises:
    six transistors formed in a device layer on a substrate;
    a bit line;
    a high-voltage line;
    a back side gate contact via in contact with a gate electrode in the device layer; and
    a low-voltage line, wherein the bit line, the high-voltage line, and the low-voltage line extend along a first direction in a first front side conductive layer disposed above the device layer, and the back side gate contact via is formed in a dielectric layer below the device layer; and
    a first word line extending along a second direction perpendicular to the first direction in a first back side conductive layer, wherein the first back side conductive layer is disposed below the device layer, and the first word line is in contact with the back side gate contact via.

15. The integrated circuit chip of claim 14, further comprising:
    a second word line extending along the second direction, wherein the second word line is disposed in a second back side conductive layer disposed below the first back side conductive layer; and
    a conductive via connecting the first word line and the second word line.

16. The integrated circuit chip of claim 15, wherein the first word line and the second word line extend along the same direction.

17. The integrated circuit chip of claim 14, wherein the low-voltage line is positioned at a boundary of each of the SRAM cell and is shared with a neighboring SRAM cell, the high-voltage line is positioned near a center of each of the SRAM cell, and the bit line is positioned between the high-voltage line and the low-voltage line.

18. The integrated circuit chip of claim 17, further comprising a second low-voltage line electrically connected to the low-voltage line in the first front side conductive layer, wherein the second low voltage line is disposed in a second front side conductive layer above the first front side conductive layer.

19. The integrated circuit chip of claim 17, further comprising a complementary bit line, and the bit line and complementary bit line positioned on opposite sides of the high-voltage line in the first front side conductive layer.

20. The integrated circuit chip of claim 14, wherein the six or more transistors are gate-all-around transistors.

* * * * *